United States Patent
Lin et al.

(10) Patent No.: US 11,488,855 B2
(45) Date of Patent: Nov. 1, 2022

(54) DIELECTRIC GAP-FILLING PROCESS FOR SEMICONDUCTOR DEVICE

(71) Applicant: Taiwan Semiconductor Manufacturing Co., Ltd., Hsinchu (TW)

(72) Inventors: Cheng-I Lin, Hsinchu (TW); Bang-Tai Tang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 78 days.

(21) Appl. No.: 16/983,647

(22) Filed: Aug. 3, 2020

(65) Prior Publication Data

US 2020/0365448 A1 Nov. 19, 2020

Related U.S. Application Data

(63) Continuation of application No. 16/036,054, filed on Jul. 16, 2018, now Pat. No. 10,748,808.

(51) Int. Cl.
| | |
|---|---|
| *H01L 21/762* | (2006.01) |
| *H01L 29/66* | (2006.01) |
| *H01L 29/78* | (2006.01) |
| *H01L 21/02* | (2006.01) |
| *H01L 29/06* | (2006.01) |

(52) U.S. Cl.
CPC .... *H01L 21/76224* (2013.01); *H01L 21/0228* (2013.01); *H01L 21/02348* (2013.01); *H01L 29/0649* (2013.01); *H01L 29/66545* (2013.01); *H01L 29/66795* (2013.01); *H01L 29/7851* (2013.01)

(58) Field of Classification Search
CPC .......... H01L 21/76224; H01L 21/0228; H01L 21/02348; H01L 29/0649; H01L 29/66545; H01L 29/66795; H01L 29/7851
USPC .......................................................... 257/283
See application file for complete search history.

(56) References Cited

U.S. PATENT DOCUMENTS

| | | | |
|---|---|---|---|
| 7,622,162 B1 | 11/2009 | van Schravendijk et al. | |
| 9,847,247 B2 | 12/2017 | Huang et al. | |
| 2005/0098822 A1* | 5/2005 | Mathew | H01L 29/40114 257/314 |
| 2007/0072424 A1* | 3/2007 | Lee | H01L 21/0228 438/690 |

(Continued)

FOREIGN PATENT DOCUMENTS

| | | | |
|---|---|---|---|
| CN | 101425461 A | | 5/2009 |
| CN | 104979266 A | * | 10/2015 |

(Continued)

*Primary Examiner* — Igwe U Anya
(74) *Attorney, Agent, or Firm* — Slater Matsil, LLP

(57) ABSTRACT

A semiconductor device and a method of forming the same are provided. The method includes forming a trench in a substrate. A liner layer is formed along sidewalls and a bottom of the trench. A silicon-rich layer is formed over the liner layer. Forming the silicon-rich layer includes flowing a first silicon precursor into a process chamber for a first time interval, and flowing a second silicon precursor and a first oxygen precursor into the process chamber for a second time interval. The second time interval is different from the first time interval. The method further includes forming a dielectric layer over the silicon-rich layer.

20 Claims, 29 Drawing Sheets

(56) References Cited

U.S. PATENT DOCUMENTS

| | | |
|---|---|---|
| 2009/0104789 A1 | 4/2009 | Mallick et al. |
| 2013/0334650 A1 | 12/2013 | Liu et al. |
| 2016/0240652 A1 | 8/2016 | Ching et al. |
| 2016/0284837 A1 | 9/2016 | Kim et al. |
| 2017/0250106 A1 | 8/2017 | Lin et al. |
| 2019/0067078 A1 | 2/2019 | Belyansky et al. |
| 2019/0131302 A1* | 5/2019 | Yi .................. H01L 29/785 |
| 2019/0164809 A1 | 5/2019 | Meyer et al. |
| 2019/0165145 A1 | 5/2019 | Ghani et al. |

FOREIGN PATENT DOCUMENTS

| | | |
|---|---|---|
| CN | 106328702 A | 1/2017 |
| CN | 107123618 A | 9/2017 |
| KR | 20090040851 A | 4/2009 |
| KR | 20090078101 A | 7/2009 |
| TW | 201730957 A | 9/2017 |

\* cited by examiner

1101

1103

1105

$C_8H_{22}N_2Si$

DIELECTRIC GAP-FILLING PROCESS FOR SEMICONDUCTOR DEVICE

PRIORITY CLAIM AND CROSS-REFERENCE

This application is a continuation and claims the benefit of U.S. patent application Ser. No. 16/036,054, filed on Jul. 16, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-6A are cross-sectional views of intermediate stages in the manufacture of a FinFET device in accordance with some embodiments.

DETAILED DESCRIPTION

Figure 1:
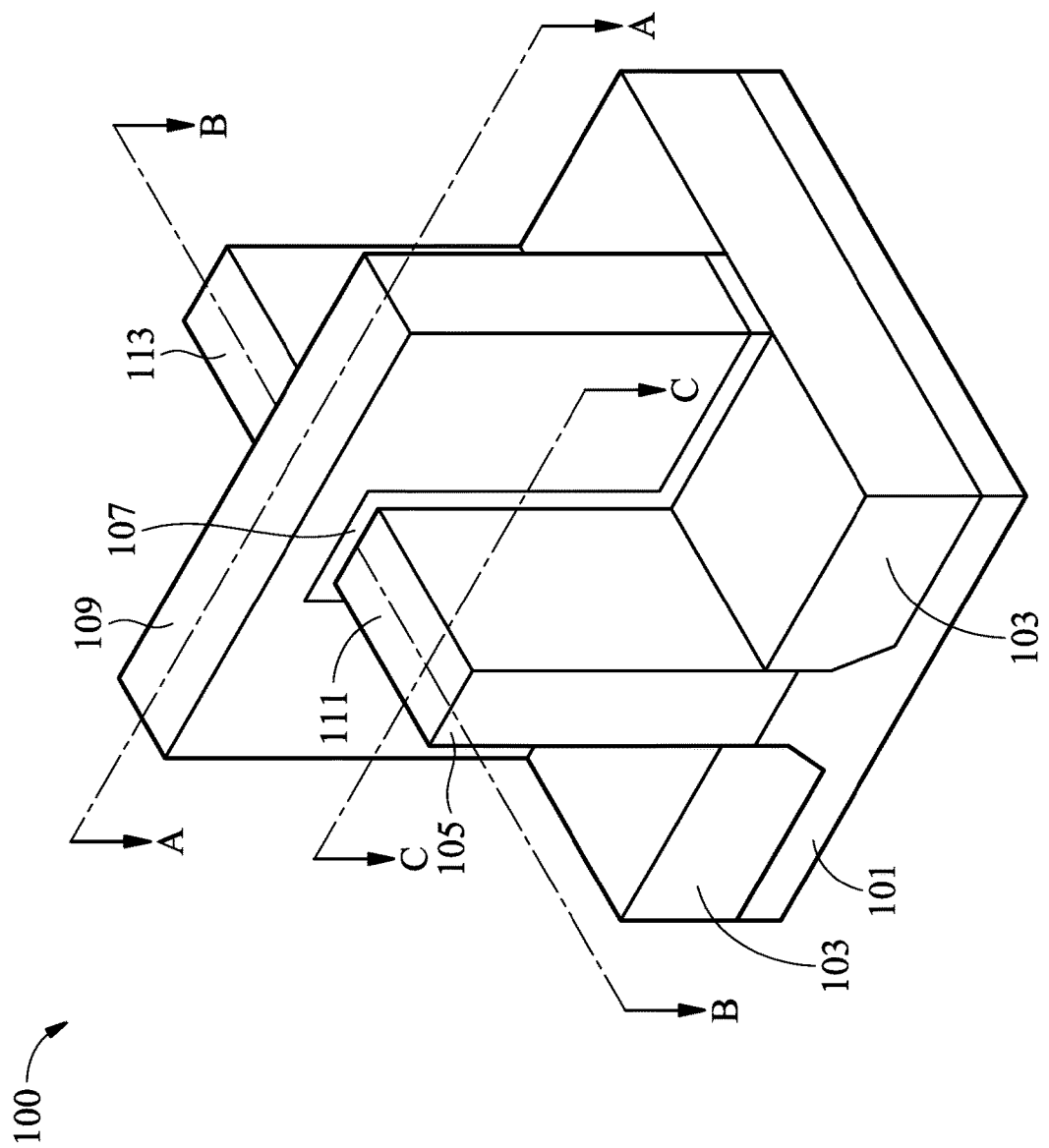
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a dielectric gap-filling process for a semiconductor device. In some embodiments, the dielectric gap-filling process may be used to form isolation regions of a semiconductor device. In other embodiments, the dielectric gap-filling process may be used to form an interlayer dielectric layer over a semiconductor device. In some embodiments, the dielectric gap-filling process includes forming a precursor soak layer in a trench or a recess before filing the trench or the recess with a dielectric material. In other embodiments, the dielectric gap-filling process further includes performing an ultraviolet/oxygen treatment followed by a thermal treatment. Various embodiments presented herein allow for forming dielectric layers having improved film quality near seam regions of the dielectric layers and allow for reducing or avoiding oxidation of a substrate. Various embodiments further allow for avoiding high temperature and lengthy anneal process and, consequently, improving a wafer-per-hour (WPH) yield and reducing production cost. Various embodiments presented herein are discussed in the context of a FinFET device formed using a gate-last process. In other embodiments, a gate-first process may be used. Also, some embodiments contemplate aspects used in planar transistor devices, multiple-gate transistor devices, 2D transistor devices, gate-all-around transistor devices, nanowire transistor devices, or the like.

FIG. 1 illustrates an example of a fin field-effect transistor (FinFET) device 100 in a three-dimensional view. The FinFET device 100 comprises a fin 105 on a substrate 101. The substrate 101 includes isolation regions 103, and the fin 105 protrudes above and from between neighboring isolation regions 103. A gate dielectric 107 is along sidewalls and over a top surface of the fin 105, and a gate electrode 109 is over the gate dielectric 107. Source/drain regions 111 and 113 are disposed in opposite sides of the fin 105 with respect to the gate dielectric 107 and gate electrode 109. The FinFET device 100 illustrated in FIG. 1 is provided for illustrative purposes only and is not meant to limit the scope of the present disclosure. As such, many variations are possible, such as epitaxial source/drain regions, multiple fins, multilayer fins, etc.

FIGS. 2A-6A, 12A-19A, 21A-25A, 14B-19B, 21B-25B, and 15C-25C are cross-sectional views of intermediate stages in the manufacturing of a FinFET device 200 in accordance with some embodiments. In FIGS. 2A-6A, 12A-19A, 21A-25A, 14B-19B, 21B-25B, and 15C-25C, figures ending with an "A" designation are illustrated along the reference cross-section A-A shown in FIG. 1, except for multiple FinFETs and multiple fins per FinFET; figures ending with a "B" designation are illustrated along the reference cross-section B-B shown in FIG. 1; and figures ending with a "C" designation are illustrated along the cross-section C-C shown in FIG. 1.

Figure 2A:
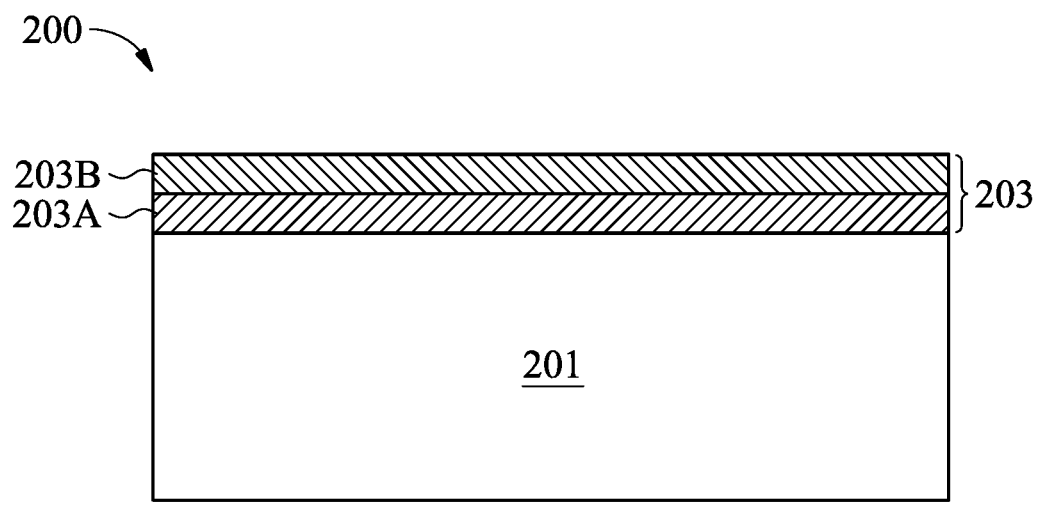

FIG. 2A illustrates a substrate 201. The substrate 201 may be a semiconductor substrate, such as a bulk semiconductor, a semiconductor-on-insulator (SOI) substrate, or the like, which may be doped (e.g., with a p-type or an n-type dopant) or undoped. The substrate 201 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 201 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like.

The substrate 201 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 201 to generate the structural and functional requirements of the design for the FinFET device 200. The integrated circuit devices may be formed using any suitable methods.

In some embodiments, appropriate wells (not shown) may be formed in the substrate 201. In some embodiments where the FinFET device 200 is an n-type device, the wells are p-wells. In some embodiments where the FinFET device 200 is a p-type device, the wells are n-wells. In other embodiments, both p-wells and n-wells are formed in the substrate 201. In some embodiments, p-type impurities are implanted into the substrate 201 to form the p-wells. The p-type impurities may be boron, $BF_2$, or the like, and may be implanted to a concentration in a range from about $10^{17}$ $cm^{-3}$ to about $10^{22}$ $cm^{-3}$. In some embodiments, n-type impurities are implanted into the substrate 201 to form the n-wells. The n-type impurities may be phosphorus, arsenic, or the like, and may be implanted to a concentration in a range from about $10^{17}$ $cm^{-3}$ to about $10^{18}$ $cm^{-3}$. After implanting the appropriate impurities, an annealing process may be performed on the substrate to activate the p-type and n-type impurities that were implanted.

FIG. 2A further illustrates the formation of a mask 203 over the substrate 201. In some embodiments, the mask 203 may be used in a subsequent etching step to pattern the substrate 201 (see FIG. 3A). In some embodiments, the mask 203 may comprise one or more mask layers. As shown in FIG. 2A, in some embodiments, the mask 203 may include a first mask layer 203A and a second mask layer 203B over the first mask layer 203A. The first mask layer 203A may be a hard mask layer, may comprise silicon oxide, silicon nitride, silicon oxynitride, silicon carbide, silicon carbonitride, a combination thereof, or the like, and may be formed using any suitable process, such as thermal oxidation, thermal nitridation, atomic layer deposition (ALD), physical vapor deposition (PVD), chemical vapor deposition (CVD), a combination thereof, or the like. The first mask layer 203A may be used to prevent or minimize etching of the substrate 201 underlying the first mask layer 203A in the subsequent etching step (see FIG. 3A). The second mask layer 203B may comprise a photoresist, and in some embodiments, may be used to pattern the first mask layer 203A for use in the subsequent etching step. The second mask layer 203B may be formed using a spin-on technique and may be patterned using acceptable photolithography techniques. In some embodiments, the mask 203 may comprise three or more mask layers.

Figure 3A:
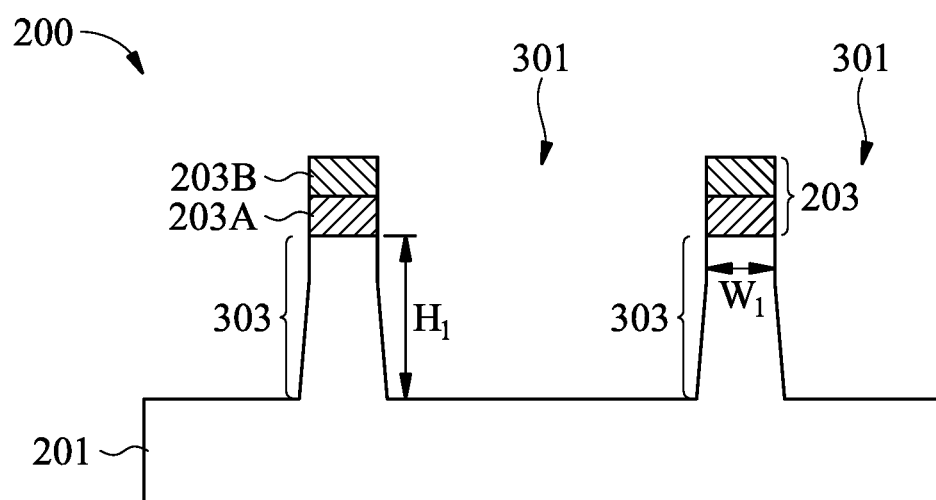

FIG. 3A illustrates the formation of semiconductor strips 303 in the substrate 201. First, the mask layers 203A and 203B are patterned, where openings in mask layers 203A and 203B expose areas of the substrate 201 where trenches 301 will be formed. Next, an etching process is performed, where the etching process creates the trenches 301 in the substrate 201 through the openings in the mask 203. The remaining portions of the substrate 201 underlying a patterned mask 203 form a plurality of semiconductor strips 303. The etching may be any acceptable etch process, such as a reactive ion etch (RIE), neutral beam etch (NBE), a combination thereof, or the like. The etch process may be anisotropic. In some embodiments, after forming the semiconductor strips 303, any remaining portions of the mask 203 may be removed by any suitable process. In other embodiments, portions of the mask 203, such as the first mask layer 203A, may remain over the semiconductor strips 303. In some embodiments, the semiconductor strips 303 may have a height $H_1$ between about 45 nm and about 55 nm. In some embodiments, the semiconductor strips 303 may have a width $W_1$ between about 5 nm and about 10 nm.

Figure 4A:
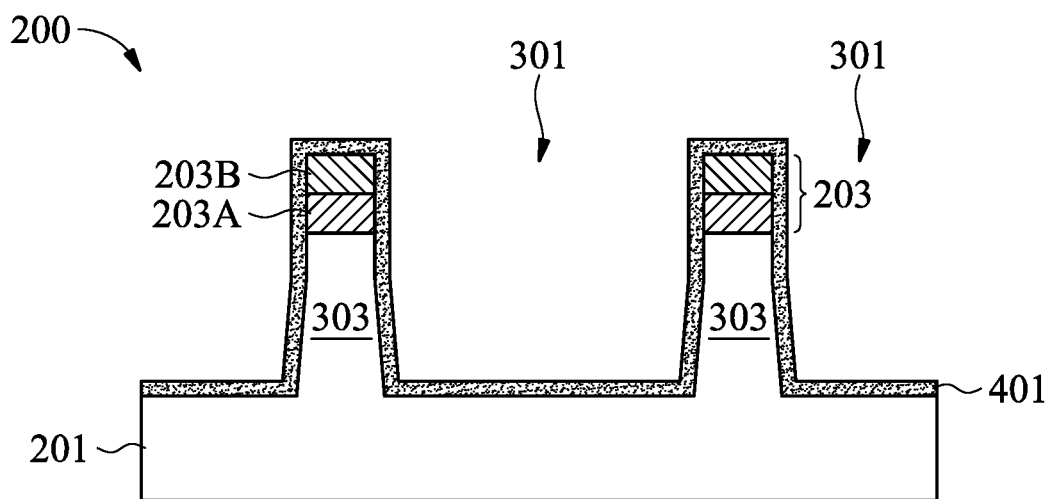
Figure 5A:
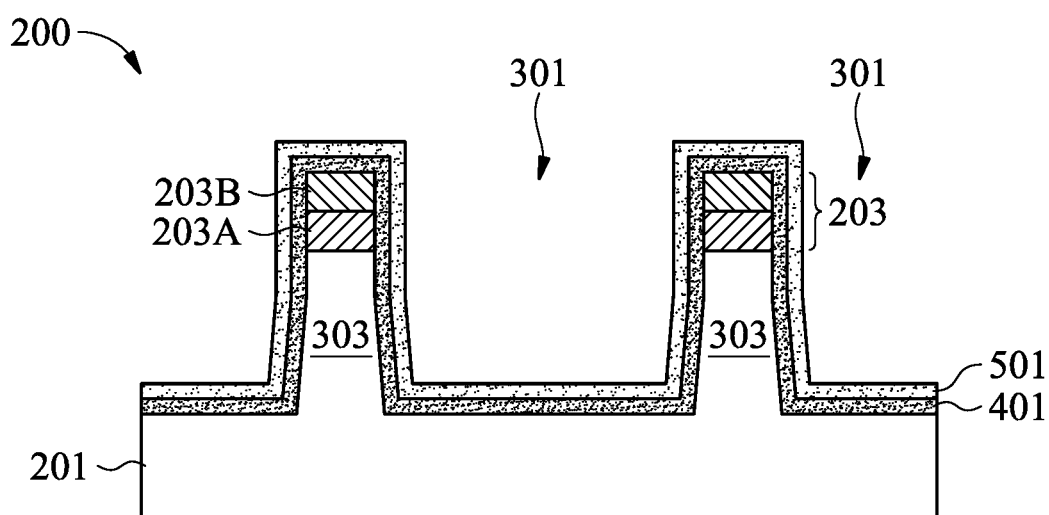
Figure 6A:
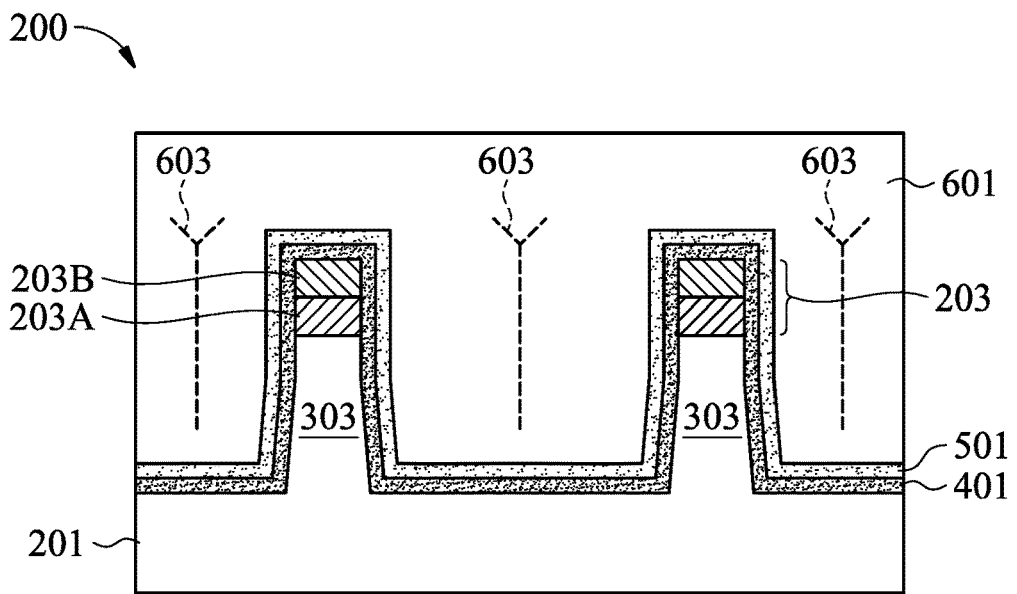

FIGS. 4A-6A illustrate a dielectric gap-filling process for forming one or more dialectic materials in the trenches 301. FIG. 4A illustrates the formation of a conformal liner layer 401 on sidewalls and bottom surfaces of the trenches 301. FIG. 5A illustrates the formation of a precursor soak layer 501 over the liner layer 401. FIG. 6A illustrated the formation of a dielectric layer 601 in the trenches 301. The details of the dielectric gap-filling process are provided below with reference to FIGS. 7-11.

Figure 7:
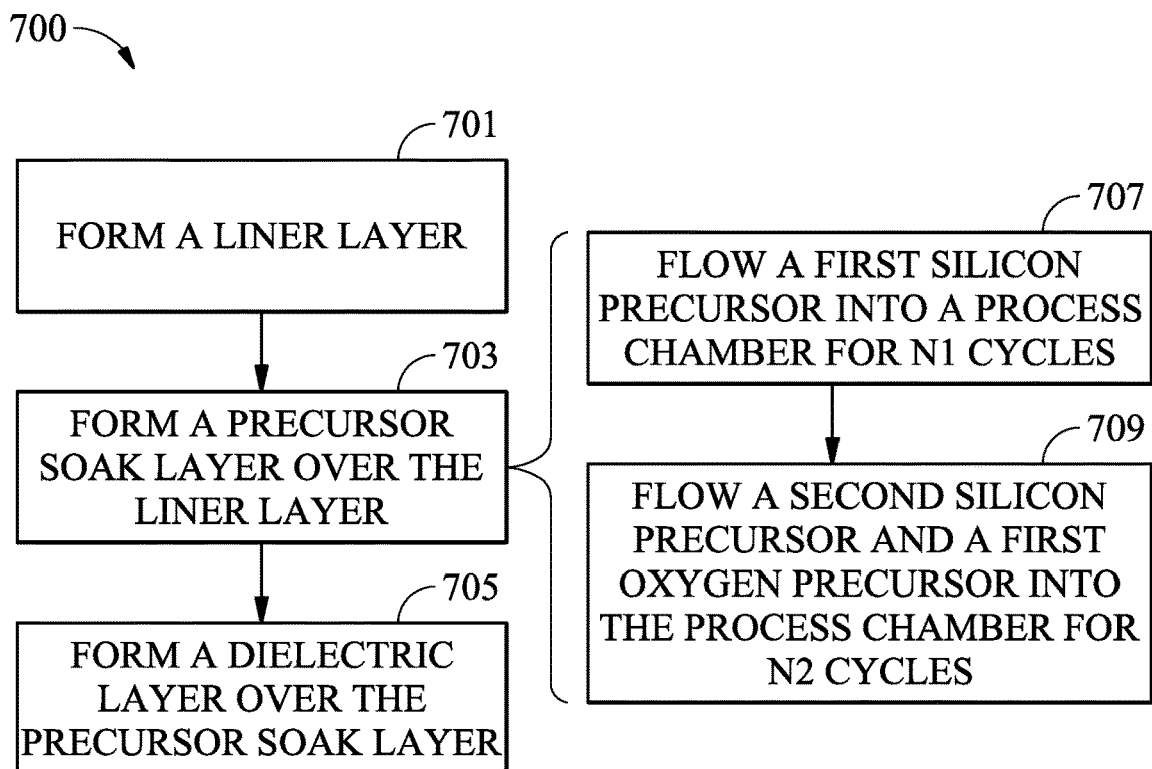
FIG. 7 is a flow diagram illustrating a dielectric gap-filling process in accordance with some embodiments.

FIG. 7 is a flow diagram illustrating a dielectric gap-filling process 700 in accordance with some embodiments. Referring to FIGS. 4A and 7, in step 701, the liner layer 401 is formed on the sidewalls and the bottom surfaces of the trenches 301. In some embodiments, the liner layer 401 may comprise a semiconductor (e.g., silicon) nitride, a semiconductor (e.g., silicon) oxide, a thermal semiconductor (e.g., silicon) oxide, a semiconductor (e.g., silicon) oxynitride, a polymer, combinations thereof, or the like. The formation of the liner layer 401 may include any suitable method, such as ALD, CVD, high density plasma chemical vapor deposition (HDP-CVD), PVD, a combination thereof, or the like. In an embodiment where the liner layer 401 comprises silicon nitride, the liner layer 401 is formed by an ALD process using a precursor such as DCS ($SiCl_2H_2$), a silicon tetrachloride, a combination thereof, or the like. In an embodiment where the liner layer 401 comprises silicon oxide, the liner layer 401 is formed by an ALD process using a precursor such as LTO520, SAM24, 3DMAS, a combination thereof, or the like. In some embodiments, the liner layer 401 has a thickness between about 20 Å and about 40 Å, such as about 20 Å.

Referring to FIGS. 5A and 7, in step 703, the precursor soak layer 501 is formed over the liner layer 401. In some embodiments, the precursor soak layer 501 may comprise an oxide, such as silicon oxide, or the like. The formation of the precursor soak layer 501 may include any suitable method, such as ALD, CVD, HDP-CVD, a combination thereof, or the like. In some embodiments wherein the precursor soak layer 501 comprises silicon oxide formed using ALD, the formation of the precursor soak layer 501 may comprise steps 707 and 709. In some embodiments, the substrate 201 comprising the structure of FIG. 4A is placed on a support structure (such as, for example, a chuck) within a process chamber. The support structure may be configured to rotate the substrate 201 during the formation of the precursor soak layer 501, where one full rotation of the substrate 201 is one cycle of the deposition process. In some embodiments, each cycle has a duration between about 6 sec and about 60 sec.

Figure 11:
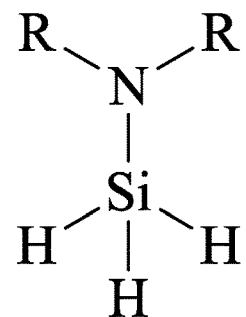
FIG. 11 illustrates structural formulas of precursors in accordance with some embodiments.
Figure 11:
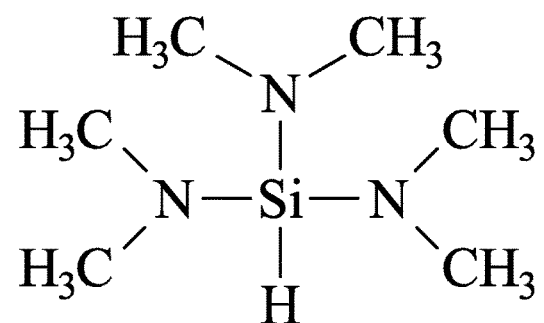
Figure 11:
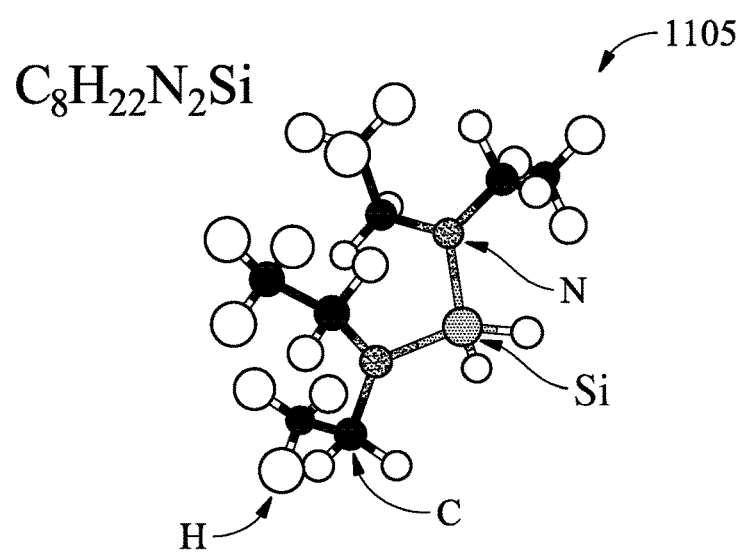

In step 707, after placing the substrate 201 within the process chamber, a first silicon precursor is flown into the process chamber. The first silicon precursor may include LT0520, SAM24, 3DMAS, a combination thereof, or the like. FIG. 11 illustrates a structural formula 1101 of LT0520, where R may comprise $C_1$-$C_5$ alkyl, $C_2$-$C_5$ alkenyl, $C_2$-$C_{20}$ alkynyl, or the like. FIG. 11 further illustrates a structural formula 1103 of 3DMAS and a structural formula 1105 of SAM24. In some embodiments, the first silicon precursor is flown into the process chamber for N1 cycles. In some embodiments, the first silicon precursor has a flow rate between about 50 sccm and about 100 sccm. In some embodiments, the first silicon precursor is flown into the process chamber for a duration between about 60 sec and about 90 sec. In some embodiments, N1 is between 1 and 5, such as 5.

In step 709, a second silicon precursor and a first oxygen precursor may be flown into the process chamber for N2 cycles. The second silicon precursor may be chosen from same candidate chemicals as the first silicon precursor described above with respect to step 707, and the description is not repeated herein. In some embodiments, the first silicon precursor and the second silicon precursor may comprise a same chemical. In other embodiments, the first silicon precursor and the second silicon precursor may comprise different chemicals. In some embodiments, the first oxygen precursor may include $O_2$, $O_3$, a combination thereof, or the like. In some embodiments where the first oxygen precursor is $O_3$, the first oxygen precursor may have a density between about 50 g/m$^3$ and about 400 g/m$^3$, such as about 300 g/m$^3$. In some embodiments, the second silicon precursor has a flow rate between about 10 sccm and about 300 sccm. In some embodiments, the first oxygen precursor has a flow rate between about 10 sccm and about 100 sccm. In some embodiments, the second silicon precursor and the first oxygen precursor are flown into the process chamber for a duration between about 6 sec and about 120 sec. In some embodiments, N2 is between 1 and 20, such as 5. In some embodiments, N2 may be different from N1.

In some embodiments, the cycle numbers N1 and N2 may be varied to adjust silicon content in the precursor soak layer 501. In some embodiments, the precursor soak layer 501 is a silicon-rich layer having silicon content of between about 30 atomic % and about 40 atomic %. In some embodiments, the cycle numbers N1 and N2 may be further varied to adjust a thickness of the precursor soak layer 501. In some embodiments, the precursor soak layer 501 may have a thickness between about 3 Å and about 5 Å.

Referring to FIGS. 6A and 7, in step 705, after forming the precursor soak layer 501, the dielectric layer 601 is formed in the trenches 301 (see FIG. 5A). The dielectric layer 601 may comprise an oxide, such as silicon oxide, a nitride, such as silicon nitride, a combination thereof, or the like, and may be formed by ALD, CVD, HDP-CVD, flowable CVD (FCVD) (e.g., a CVD-based material deposition in a remote plasma system and post curing to make it convert to another material, such as an oxide), a combination thereof, or the like. Other insulation materials formed by any acceptable processes may be also used. In some embodiments where the dielectric layer 601 comprises silicon oxide formed using ALD, a third silicon precursor and a second oxygen precursor is flown into the process chamber for Nd cycles. The third silicon precursor may be chosen from same candidate chemicals as the first silicon precursor described above with respect to step 707, and the description is not repeated herein. In some embodiments, the first silicon precursor, the second silicon precursor and the third silicon precursor may comprise a same chemical. In other embodiments, the third silicon precursor and at least one of the first silicon precursor and the second silicon precursor may comprise different chemicals. The second oxygen precursor may be chosen from same candidate chemicals as the first oxygen precursor described above with respect to step 709, and the description is not repeated herein. In some embodiments, the first oxygen precursor and the second oxygen precursor may comprise a same chemical. In other embodiments, the first oxygen precursor and the second oxygen precursor may comprise different chemicals.

In some embodiments, the deposition process for forming the dielectric layer 601 may be a plasma-assisted process or a plasma-enhanced process. In such embodiments, an oxygen-containing plasma, such as an $O_2$ plasma, is flown into the process chamber in addition to the third silicon precursor and the second oxygen precursor. Radio frequency (RF) power for generating the oxygen-containing plasma may be between about 2 KW and about 3 KW. In some embodiments, the third silicon precursor has a flow rate between about 10 sccm and about 300 sccm. In some embodiments, the second oxygen precursor has a flow rate between about 10 sccm and about 100 sccm. In some embodiments, the oxygen-containing plasma has a flow rate between about 10 sccm and about 100 sccm. In some embodiments, the third silicon precursor and the second oxygen precursor are flown into the process chamber for a duration between about 6 sec and about 120 sec. In some embodiments, Nd is between 1 and 20, such as 5.

Referring further to FIG. 6A, the dielectric layer 601 may comprise a seam 603 within each of the trenches 301 (see FIG. 5A) due to the deposition process properties. In some embodiments, regions of the dielectric layer 601 near the seams 603 may be weaker than the rest of the dielectric layer 601. For example, the regions of the dielectric layer 601 near the seams 603 may have a higher etch rate than the rest of the dielectric layer 601 and voids may be formed near the seams 603 during and/or after preforming subsequent processes on the dielectric layer 601, such as a polishing process, an etching process, or the like. By forming the precursor soak layer 501 before forming the dielectric layer 601, the regions of the dielectric layer 601 near the seams 603 may be strengthened and formation of voids in the dielectric layer 601 may be reduced or avoided. In some embodiments where the precursor soak layer 501 and the dielectric layer 601 comprise a same material, an interface between the precursor soak layer 501 and the dielectric layer 601 may not be detectable.

Figure 8:
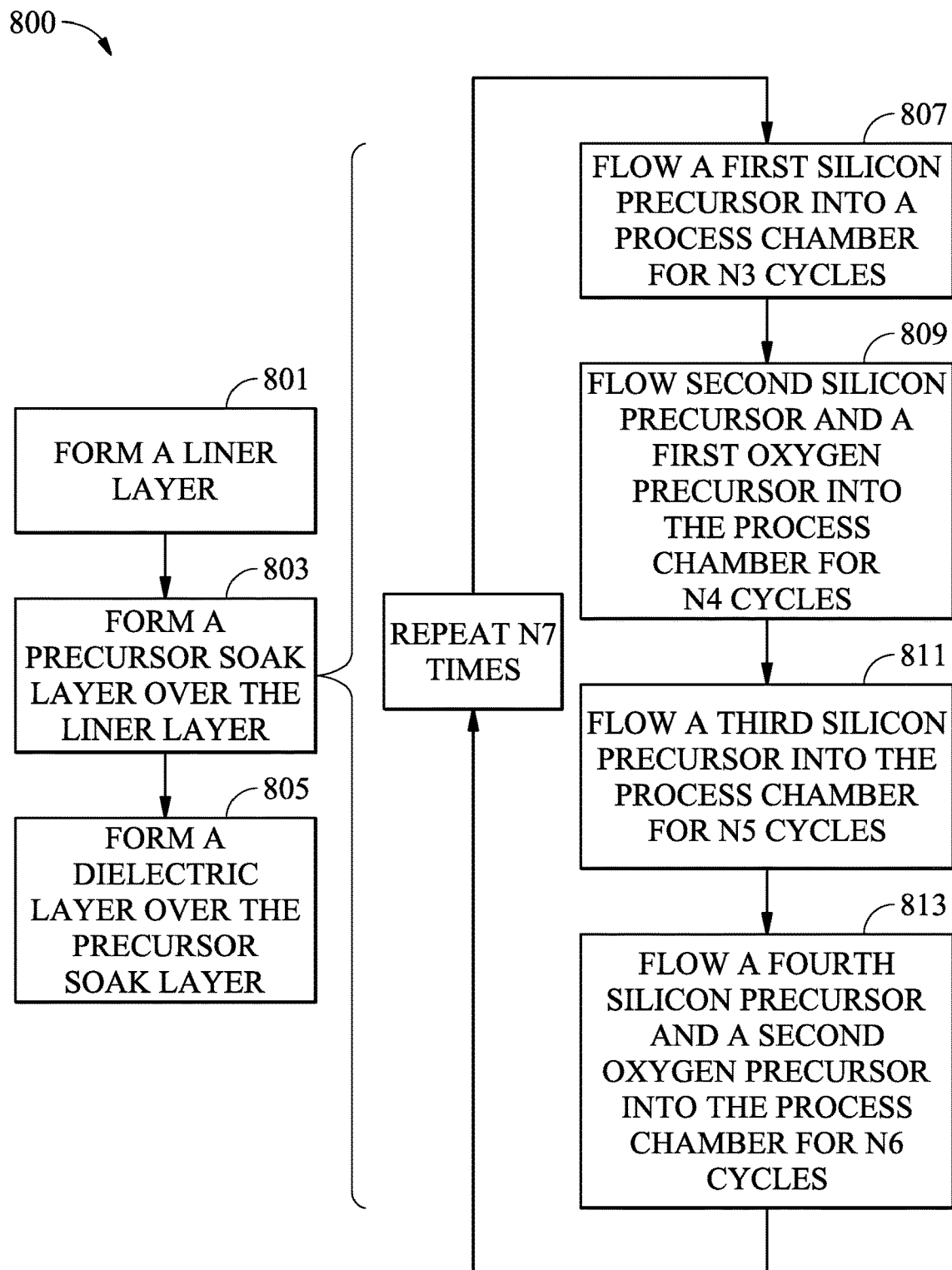
FIG. 8 is a flow diagram illustrating a dielectric gap-filling process in accordance with some embodiments.

FIG. 8 is a flow diagram illustrating a dielectric gap-filling process 800 in accordance with some embodiments. Referring to FIGS. 4A and 8, in step 801, the liner layer 401 is formed on the sidewalls and the bottom surfaces of the trenches 301. In some embodiments, step 801 is similar to step 701 described above with reference to FIG. 7 and the description is not repeated herein.

Referring to FIGS. 5A and 8, in step 803, the precursor soak layer 501 is formed over the liner layer 401. In some embodiments wherein the precursor soak layer 501 comprises silicon oxide formed using ALD, the formation of the precursor soak layer 501 may comprise one or more deposition loops, where each deposition loop comprises steps 807, 809, 811 and 813. In some embodiments, step 803 may comprise N7 deposition loops. In some embodiments, N7 is between about 1 and bout 5. In some embodiments, the substrate 201 comprising the structure of FIG. 4A is placed on a support structure (such as, for example, a chuck) within a process chamber.

In step 807, after placing the substrate 201 within the process chamber, a first silicon precursor is flown into the process chamber. The first silicon precursor may include LT0520, SAM24, 3DMAS, a combination thereof, or the like. In some embodiments, the first silicon precursor is flown into the process chamber for N3 cycles. In some embodiments, the first silicon precursor has a flow rate between about 50 sccm and about 100 sccm. In some embodiments, the first silicon precursor is flown into the process chamber for a duration between about 60 sec and about 90 sec. In some embodiments, N3 is between 1 and 20, such as 5.

In step 809, a second silicon precursor and a first oxygen precursor may be flown into the process chamber for N4 cycles. The second silicon precursor may be chosen from same candidate chemicals as the first silicon precursor described above with respect to step 807, and the description is not repeated herein. In some embodiments, the first silicon precursor and the second silicon precursor may comprise a same chemical. In other embodiments, the first silicon precursor and the second silicon precursor may comprise different chemicals. In some embodiments, the first oxygen precursor may include $O_2$, $O_3$, a combination thereof, or the like. In some embodiments where the first oxygen precursor is $O_3$, the first oxygen precursor may have a density between about 100 $g/m^3$ and about 300 $g/m^3$, such as about 300 $g/m^3$. In some embodiments, the second silicon precursor has a flow rate between about 50 sccm and about 300 sccm. In some embodiments, the first oxygen precursor has a flow rate between about 10 sccm and about 100 sccm. In some embodiments, the second silicon precursor and the first oxygen precursor are flown into the process chamber for a duration between about 6 sec and about 60 sec. In some embodiments, N4 is between 1 and 20, such as 5. In some embodiments, N4 may be different from N3.

In step 811, a third silicon precursor is flown into the process chamber for N5 cycles. The third silicon precursor may be chosen from same candidate chemicals as the first silicon precursor described above with respect to step 807, and the description is not repeated herein. In some embodiments, the first silicon precursor, the second silicon precursor and the third silicon precursor may comprise a same chemical. In other embodiments, the third silicon precursor and at least one of the first silicon precursor and the second silicon precursor may comprise different chemicals. In some embodiments, the third silicon precursor has a flow rate between about 50 sccm and about 100 sccm. In some embodiments, the third silicon precursor is flown into the process chamber for a duration between about 12 sec and about 24 sec. In some embodiments, N5 is between 1 and 5, such as 2. In some embodiments, N5 may be different from at least one of N3 and N4.

In step 813, a fourth silicon precursor and a second oxygen precursor may be flown into the process chamber for N6 cycles. The fourth silicon precursor may be chosen from same candidate chemicals as the first silicon precursor described above with respect to step 807, and the description is not repeated herein. In some embodiments, the first silicon precursor, the second silicon precursor, the third silicon precursor and the fourth silicon precursor may comprise a same chemical. In other embodiments, the fourth silicon precursor and at least one of the first silicon precursor, the second silicon precursor and the third silicon precursor may comprise different chemicals. The second oxygen precursor may be chosen from same candidate chemicals as the first oxygen precursor described above with respect to step 809, and the description is not repeated herein. In some embodiments, the first oxygen precursor and the second oxygen precursor may comprise a same chemical. In other embodiments, the first oxygen precursor and the second oxygen precursor may comprise different chemicals. In some embodiments where the second oxygen precursor is $O_3$, the second oxygen precursor may have a density between about 100 $g/m^3$ and about 300 $g/m^3$, such as about 300 $g/m^3$. In some embodiments, the fourth silicon precursor has a flow rate between about 10 sccm and about 300 sccm. In some embodiments, the second oxygen precursor has a flow rate between about 10 sccm and about 100 sccm. In some embodiments, the fourth silicon precursor and the second oxygen precursor are flown into the process chamber for a duration between about 6 sec and about 120 sec. In some embodiments, N6 is between 1 and 5, such as 3. In some embodiments, N6 may be different from at least one of N3, N4 and N5.

In some embodiments, the cycle numbers N3, N4, N5, N6 and N7 may be varied to adjust silicon content in the precursor soak layer 501. In some embodiments, the precursor soak layer 501 is silicon-rich layer having silicon content of between about 30 atomic % and about 40 atomic %. In some embodiments, the cycle numbers N3, N4, N5, N6 and N7 may be further varied to adjust a thickness of the precursor soak layer 501. In some embodiments, the precursor soak layer 501 may have a thickness between about 8 Å and about 12 Å. In some embodiments, the precursor soak layer 501 formed in step 803 of the dielectric gap-filling process 800 may be thicker than the precursor soak layer 501 formed in step 703 of the dielectric gap-filling process 700 (see FIG. 7). By increasing the thickness of the precursor soak layer 501, oxidation of the substrate 201 may be prevented or reduced.

Referring to FIGS. 6A and 8, in step 805, after forming the precursor soak layer 501, the dielectric layer 601 is formed in the trenches 301 (see FIG. 5A). In some embodiments, step 805 may be similar to step 705 of the dielectric gap-filling process 700 described above with reference to FIG. 7 and the description is not repeated herein.

Figure 9:
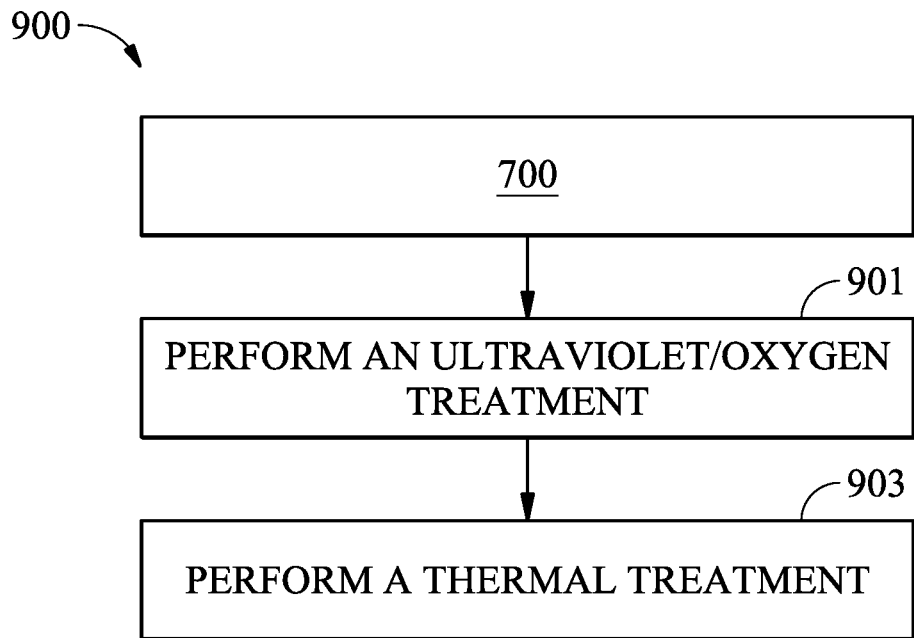
FIG. 9 is a flow diagram illustrating a dielectric gap-filling process in accordance with some embodiments.

FIG. 9 is a flow diagram illustrating a dielectric gap-filling process 900 in accordance with some embodiments. Referring to FIGS. 9 and 6A, after performing the dielectric gap-filling process 700 illustrated above with reference to FIG. 7, the dielectric gap-filling process 900 continues to step 901, where an ultraviolet/oxygen treatment is performed on the dielectric layer 601. In some embodiments, the ultraviolet/oxygen treatment comprises subjecting the dielectric layer 601 to ultraviolet (UV) radiation in an oxygen ambient. In some embodiment, an intensity of the UV radiation is between about 15 mW/cm$^2$ and about 25 mW/cm$^2$. In some embodiments, the oxygen ambient may comprise a molecular oxygen gas ($O_2$), or the like. In some embodiments, the UV radiation breaks weak bonds (such as, for example, Si—H bonds) and precursor byproducts near the seams 603 of the dielectric layer 601, while the oxygen ambient provides the oxygen source to form stronger bonds (such as, for example, Si—O bonds) near the seams 603 of the dielectric layer 601.

In step 903, after performing the ultraviolet/oxygen treatment, a thermal treatment is performed on the dielectric layer 601. In some embodiments, the thermal treatment may be a dry thermal treatment, a wet thermal treatment, a combination thereof, or the like. In some embodiments where the thermal treatment is a dry thermal treatment, the thermal treatment may be performed at a temperature between about 400° C. and about 700° C. for a duration between about 1 hr and about 2 hr. In some embodiments where the thermal treatment is a wet thermal treatment, the thermal treatment may be performed at a temperature between about 400° C. and about 700° C. for a duration between about 1 hr and about 2 hr. Furthermore, in some embodiments where the thermal treatment is a wet thermal treatment, the thermal treatment is performed in an ambient comprising water ($H_2O$) vapor. In some embodiments, the water vapor may have a pressure between about 600 mmHg and about 1200 mmHg. In some embodiments, the thermal treatment densifies the dielectric layer 601 and facilitates strong bond (such as, for example, Si—O bonds) formation at the seams 603 of the dielectric layer 601.

Figure 10:
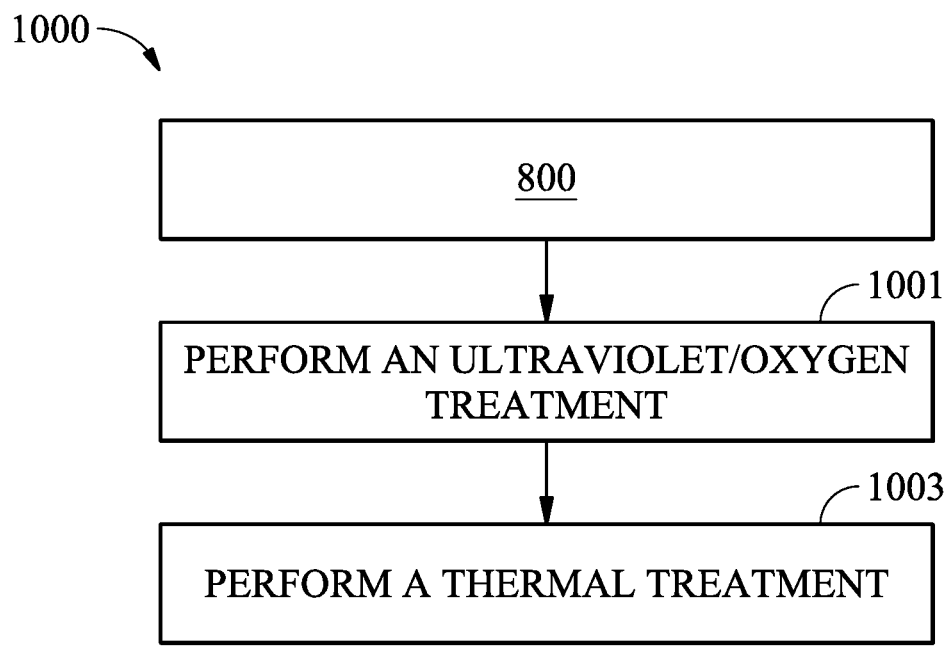
FIG. 10 is a flow diagram illustrating a dielectric gap-filling process in accordance with some embodiments.

FIG. 10 is a flow diagram illustrating a dielectric gap-filling process 1000 in accordance with some embodiments. Referring to FIGS. 10 and 6A, after performing the dielectric gap-filling process 800 illustrated above with reference to FIG. 8, the dielectric gap-filling process 1000 continues to step 1001, where an ultraviolet/oxygen treatment is performed on the dielectric layer 601. In some embodiments, step 1001 is similar to step 901 of the dielectric gap-filling process 900 described above with reference to FIG. 9 and the description is not repeated herein. In step 1003, after performing the ultraviolet/oxygen treatment, a thermal treatment is performed on the dielectric layer 601. In some embodiments, step 1003 is similar to step 903 of the dielectric gap-filling process 900 described above with reference to FIG. 9 and the description is not repeated herein.

Figure 12A:
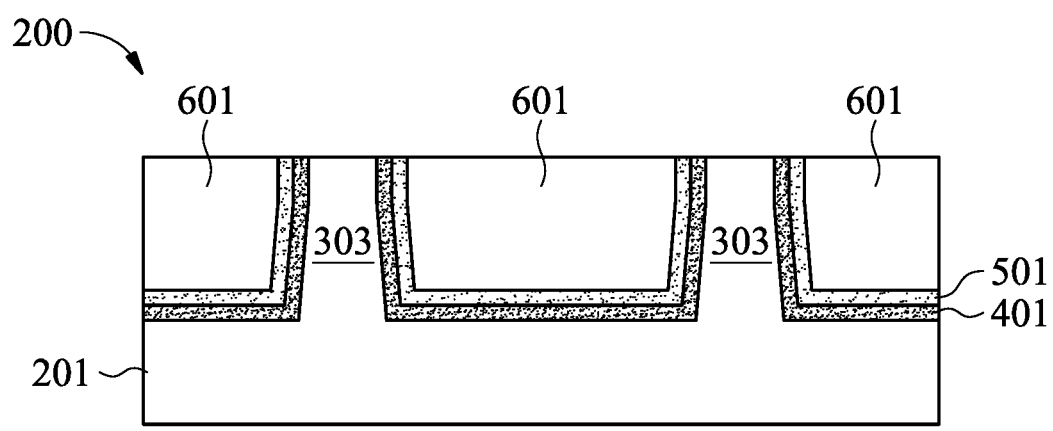
FIGS. 12A and 13A are cross-sectional views of intermediate stages in the manufacture of a FinFET device in accordance with some embodiments.

Referring to FIG. 12A, a planarization process, such as a chemical mechanical polishing (CMP), may remove any excess portions of the dielectric layer 601, the precursor soak layer 501 and the liner layer 401, such that top surfaces of the dielectric layer 601 and top surfaces of the semiconductor strips 303 are coplanar. In some embodiments where portions of the mask 203 (see FIG. 6A) remain over the semiconductor strips 303 after forming the semiconductor strips 303, the planarization process may also remove the remaining portions of the mask 203.

Figure 13A:
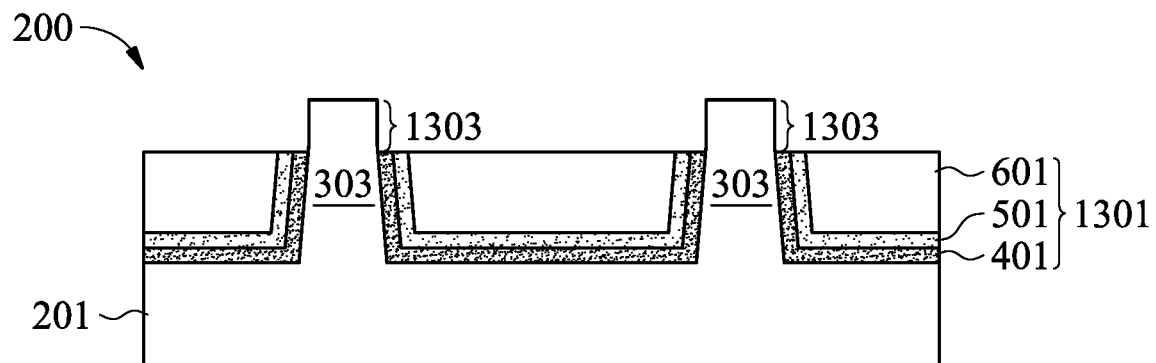

FIG. 13A illustrates the recessing of the dielectric layer 601, the precursor soak layer 501 and the liner layer 401, such that remaining portions of the dielectric layer 601, the precursor soak layer 501 and the liner layer 401 form isolation regions 1301. The isolation regions 1301 may be also referred to as shallow trench isolation (STI) regions. The dielectric layer 601, the precursor soak layer 501 and the liner layer 401 are recessed such that fins 1303 protrude from between neighboring isolation regions 1301. Further, the top surfaces of the isolation regions 1301 may have a flat surface as illustrated, a convex surface, a concave surface (such as dishing), or a combination thereof. The top surfaces of the isolation regions 1301 may be formed flat, convex, and/or concave by an appropriate etch. The dielectric layer 601, the precursor soak layer 501 and the liner layer 401 may be recessed using one or more acceptable etching processes.

A person having ordinary skill in the art will readily understand that the process described with respect to FIGS. 2A-6A, 12A and 13A is just one example of how the fins 1303 may be formed. In other embodiments, a dielectric layer can be formed over a top surface of the substrate 201; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 303 in FIG. 12A can be recessed, and one or more materials different from the semiconductor strips 303 may be epitaxially grown in their place. In even further embodiments, a dielectric layer can be formed over a top surface of the substrate 201; trenches can be etched through the dielectric layer; heteroepitaxial structures can be epitaxially grown in the trenches using one or more materials different from the substrate 201; and the dielectric layer can be recessed such that the heteroepitaxial structures protrude from the dielectric layer to form fins 1303.

In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. In various embodiments, the fins 1303 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 14A:
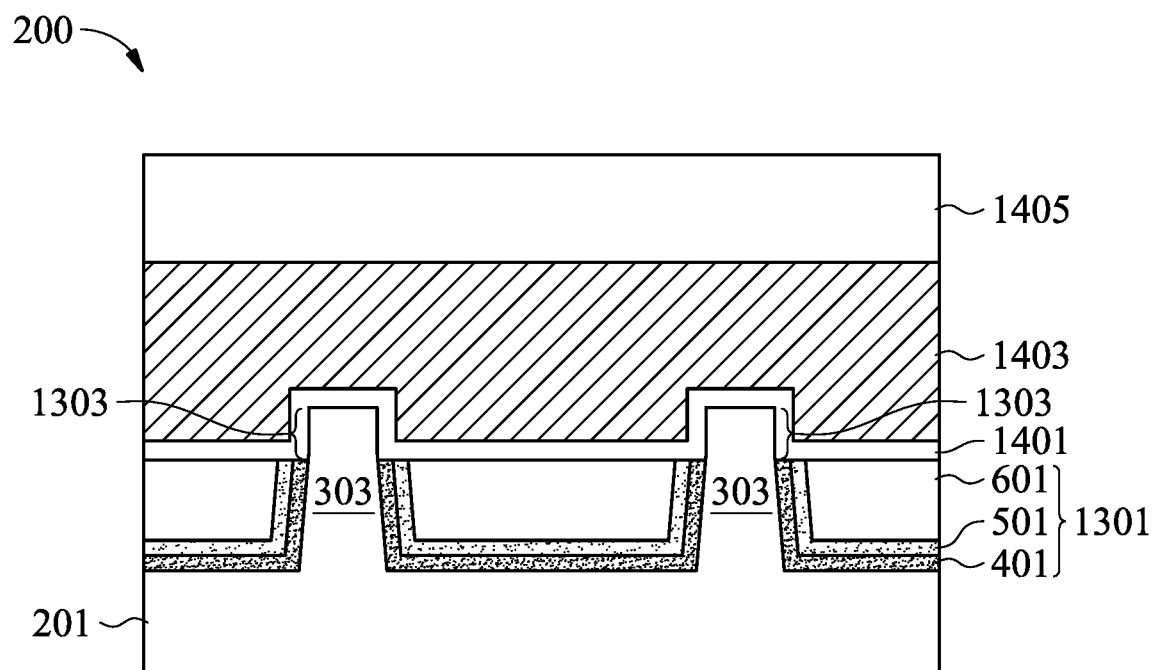
FIGS. 14A and 14B are cross-sectional views of an intermediate stage in the manufacture of a FinFET device in accordance with some embodiments.
Figure 14B:
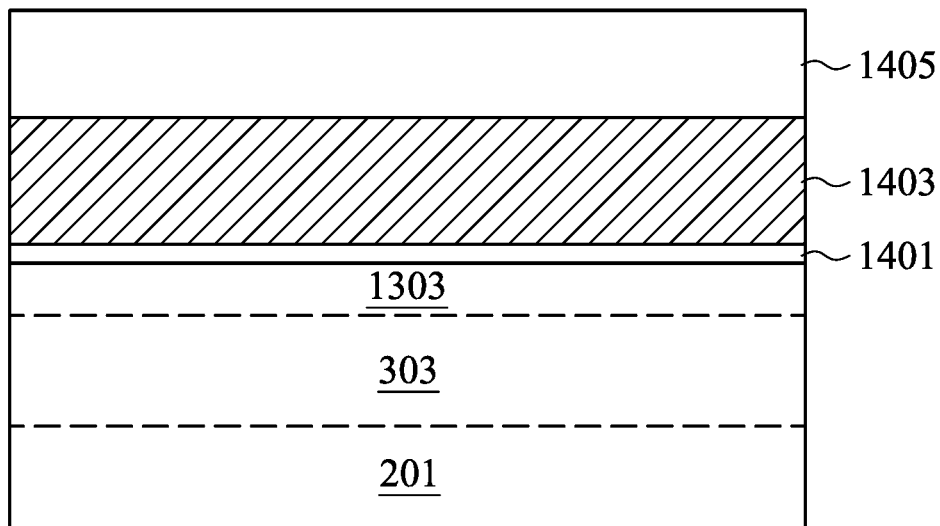

Referring to FIGS. 14A and 14B, a dielectric layer 1401 is formed on sidewalls and top surfaces of the fins 1303. In some embodiments, the dielectric layer 1401 may be also formed over the isolation regions 1301. In other embodiments, top surfaces of the isolation regions 1301 may be free from the dielectric layer 1401. The dielectric layer 1401 may comprise an oxide, such as silicon oxide, or the like, and may be deposited (using, for example, ALD, CVD, PVD, a combination thereof, or the like) or thermally grown (for example, using thermal oxidation, or the like) according to acceptable techniques. A gate electrode layer 1403 is formed over the dielectric layer 1401, and a mask 1405 is formed over the gate electrode layer 1403. In some embodiments, the gate electrode layer 1403 may be deposited over the dielectric layer 1401 and then planarized using, for example, a CMP process. The mask 1405 may be deposited over the gate electrode layer 1403. The gate electrode layer 1403 may be made of, for example, polysilicon, although other materials that have a high etching selectivity with respect to the material of the isolation regions 1301 may also be used. The mask 1405 may include one or more layers of, for example, silicon oxide, silicon nitride, silicon oxynitride, silicon carbide, silicon carbonitride, a combination thereof, or the like, and may be formed using any suitable process, such as thermal oxidation, thermal nitridation, ALD, PVD, CVD, a combination thereof, or the like.

Figure 15A:
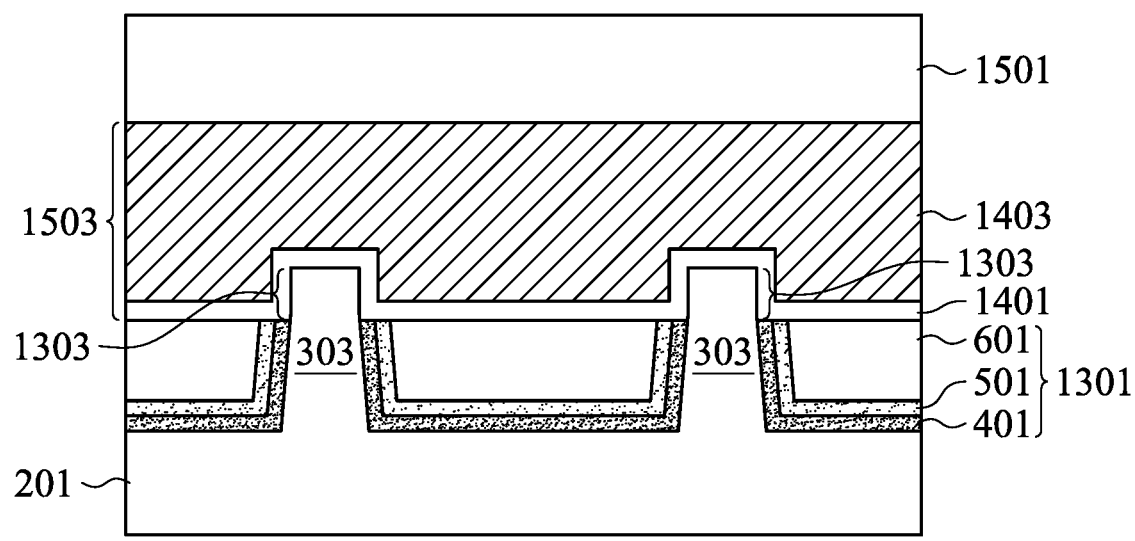
FIGS. 15A, 15B and 15C are cross-sectional views of an intermediate stage in the manufacture of a FinFET device in accordance with some embodiments.
Figure 15B:
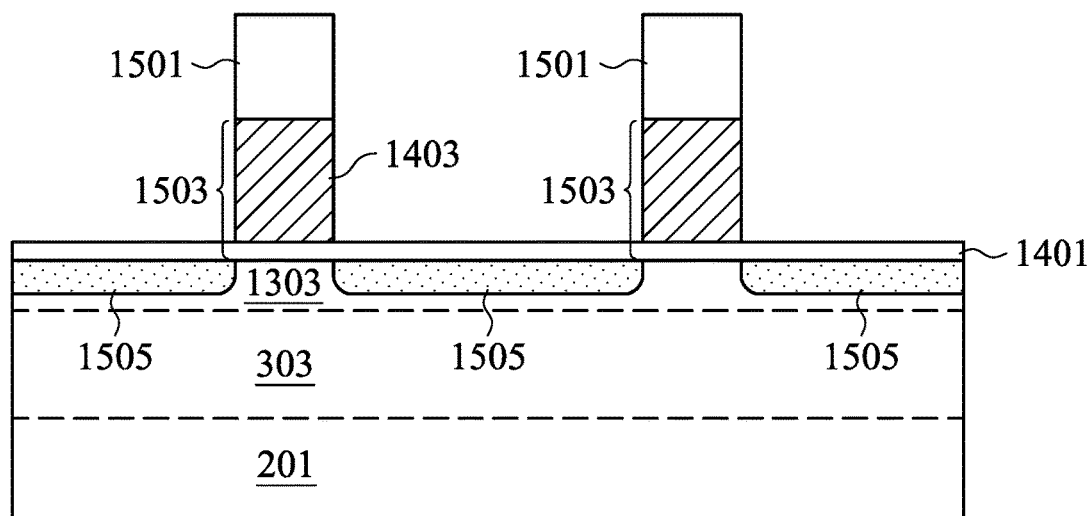
Figure 15C:
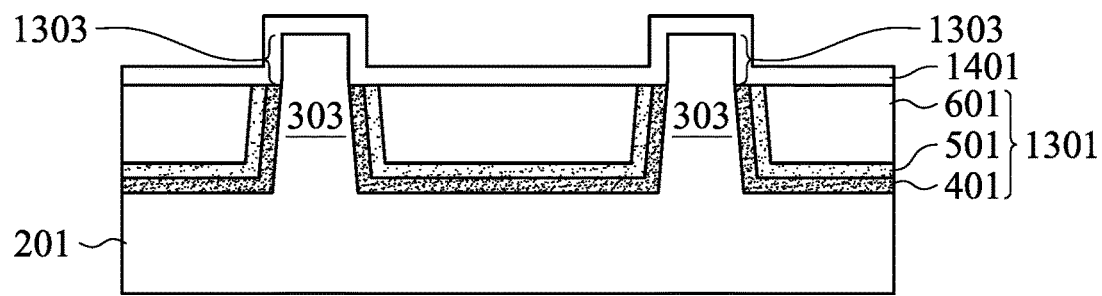

Referring to FIGS. 15A, 15B, and 15C, the mask 1405 (see FIGS. 14A and 14B) may be patterned using acceptable photolithography and etching techniques to form a patterned mask 1501. The pattern of the patterned mask 1501 is transferred to the gate electrode layer 1403 by an acceptable etching technique to form gates 1503. The gates 1503 cover respective channel regions of the fins 1303 (see FIG. 15B) while exposing source/drain regions of the fins 1303 (see FIGS. 15B and 15C). The gates 1503 may also have a lengthwise direction substantially perpendicular to the lengthwise direction of respective fins 1303, within process variations (see FIG. 15A). A size of the gates 1503, and a pitch between the gates 1503, may depend on a region of a die in which the gates 1503 are formed. In some embodiments, the gates 1503 may have a larger size and a larger pitch when located in, for example, an input/output region of a die (e.g., where input/output circuitry is disposed) than when located in, for example, a logic region of a die (e.g., where logic circuitry is disposed). As described below in greater detail, the gates 1503 are sacrificial gates and are subsequently replaced by replacement gates. Accordingly, the gates 1503 may also be referred to as sacrificial gates.

Referring further to FIGS. 15A, 15B, and 15C, lightly doped source/drain (LDD) regions 1505 may be formed in the substrate 201. Similar to the implantation process discussed above with reference to FIG. 2A, appropriate impurities are implanted into the fins 1303 to form the LDD regions 1505. In some embodiments where the FinFET device 200 is a p-type device, p-type impurities are implanted into the fins 1303 to form p-type LDD regions 1505. In some embodiments where the FinFET device 200 is an n-type device, n-type impurities are implanted into the fins 1303 to form n-type LDD regions 1505. During the implantation of the LDD regions 1505, the gates 1503 and the patterned mask 1501 may act as a mask to prevent (or at least reduce) dopants from implanting into channel regions of the fins 1303. Thus, the LDD regions 1505 may be formed substantially in source/drain regions of the fins 1303. The n-type impurities may be any of the n-type impurities previously discussed, and the p-type impurities may be any of the p-type impurities previously discussed. The LDD regions 1505 may have a concentration of impurities between about $10^{20}$ cm$^{-3}$ to about $10^{21}$ cm$^{-3}$. After the implantation process, an annealing process may be performed to activate the implanted impurities.

Figure 16A:
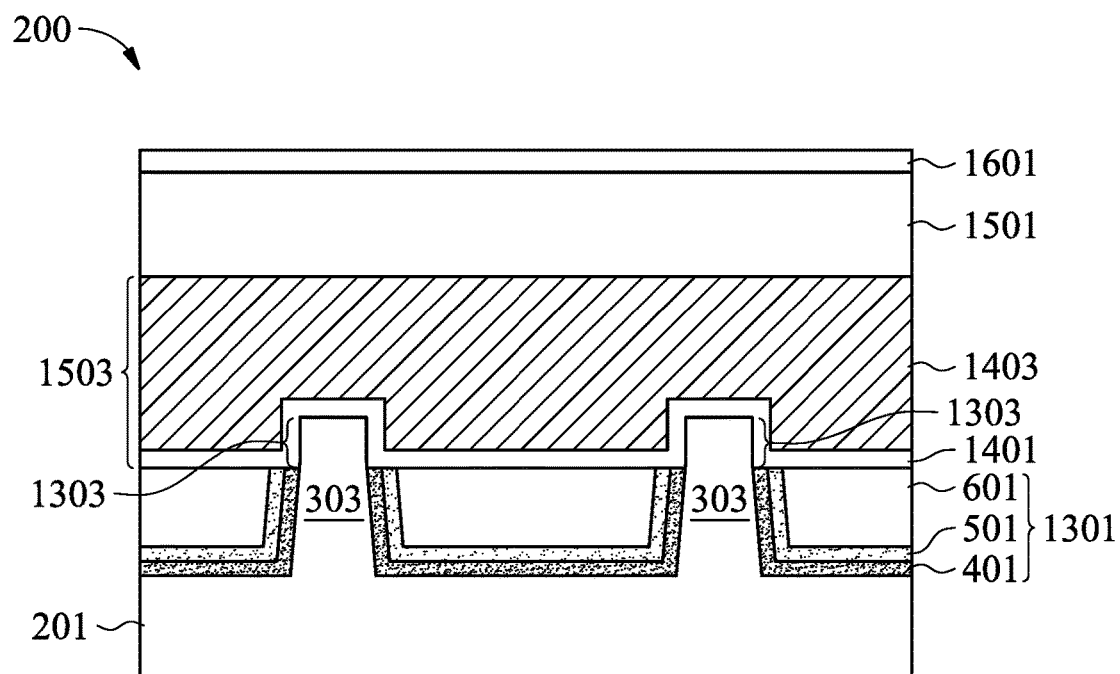
FIGS. 16A, 16B and 16C are cross-sectional views of an intermediate stage in the manufacture of a FinFET device in accordance with some embodiments.
Figure 16B:
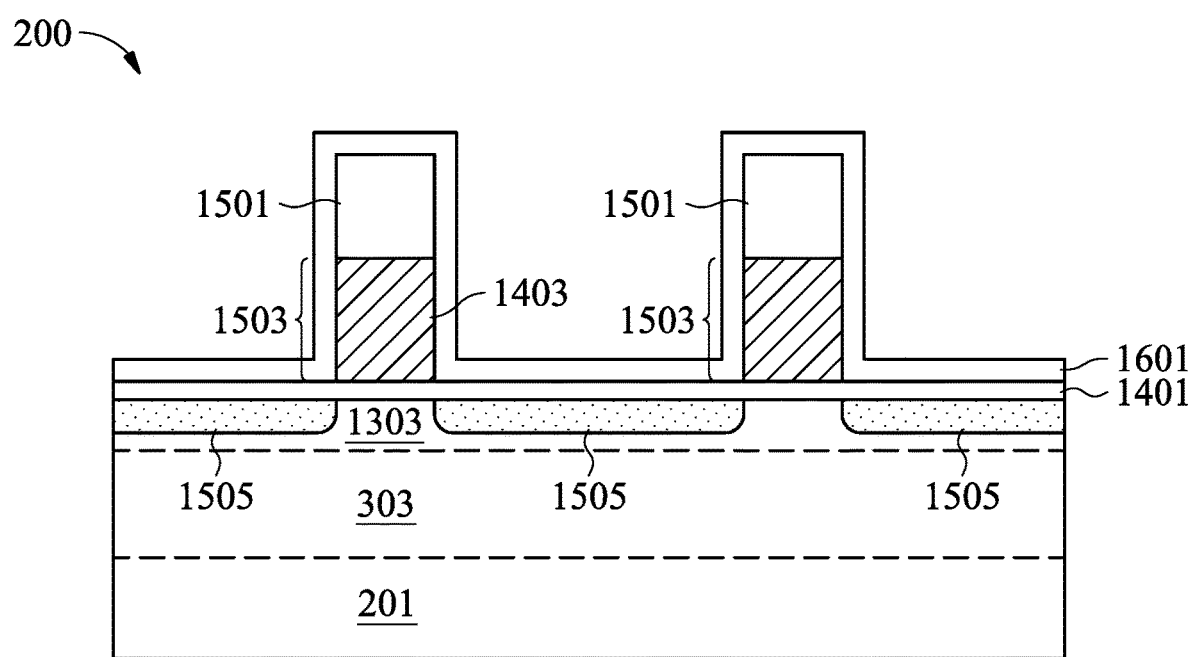
Figure 16C:
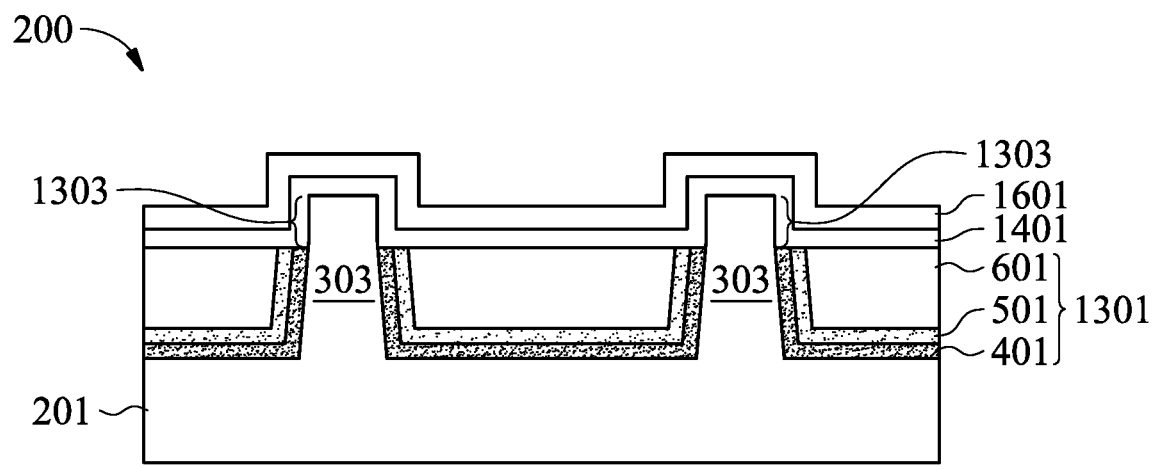

FIGS. 16A-16C and 17A-17C illustrate the formation of spacers 1701 on sidewalls of the gates 1503 and sidewalls of the fins 1303 in accordance with some embodiments. Referring first to FIGS. 16A, 16B, and 16C, a dielectric layer 1601 is blanket formed on exposed surfaces of the gates 1503, the patterned mask 1501, and the dielectric layer 1401. In some embodiments, the dielectric layer 1601 may comprise silicon nitride (SiN), silicon oxynitride (SiON), silicon oxycarbide (SiOC), silicon carbonitride (SiCN), silicon carboxynitride (SiOCN), a combination thereof, or the like, and may be formed using CVD, ALD, a combination thereof, or the like.

Figure 17A:
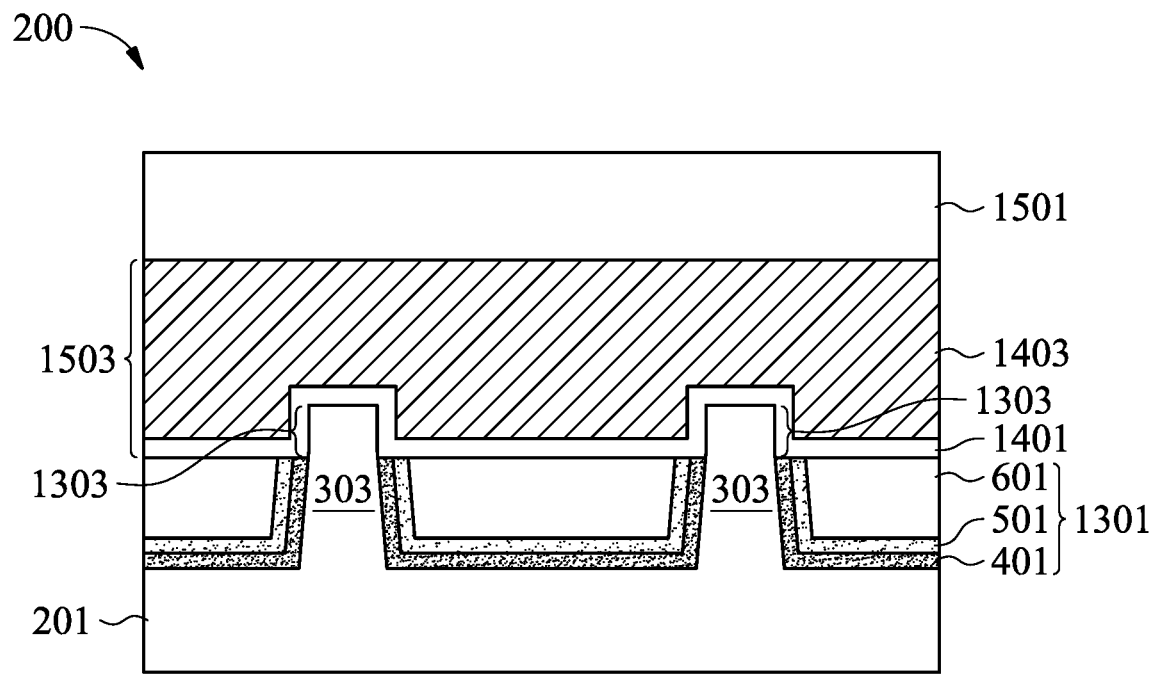
FIGS. 17A, 17B and 17C are cross-sectional views of an intermediate stage in the manufacture of a FinFET device in accordance with some embodiments.
Figure 17B:
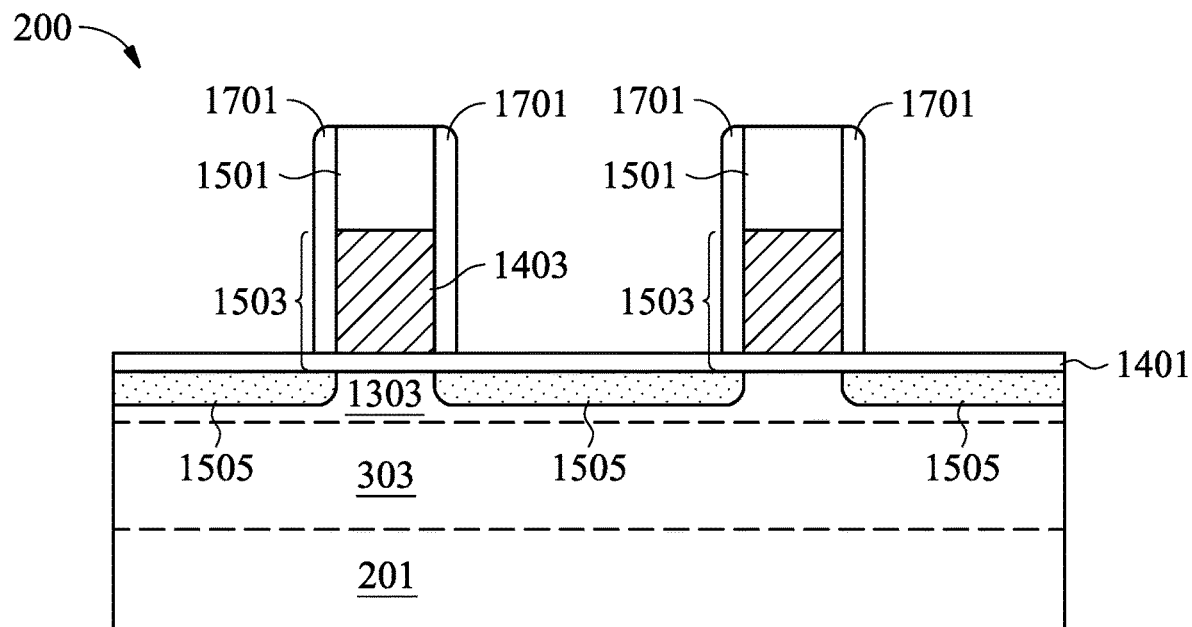
Figure 17C:
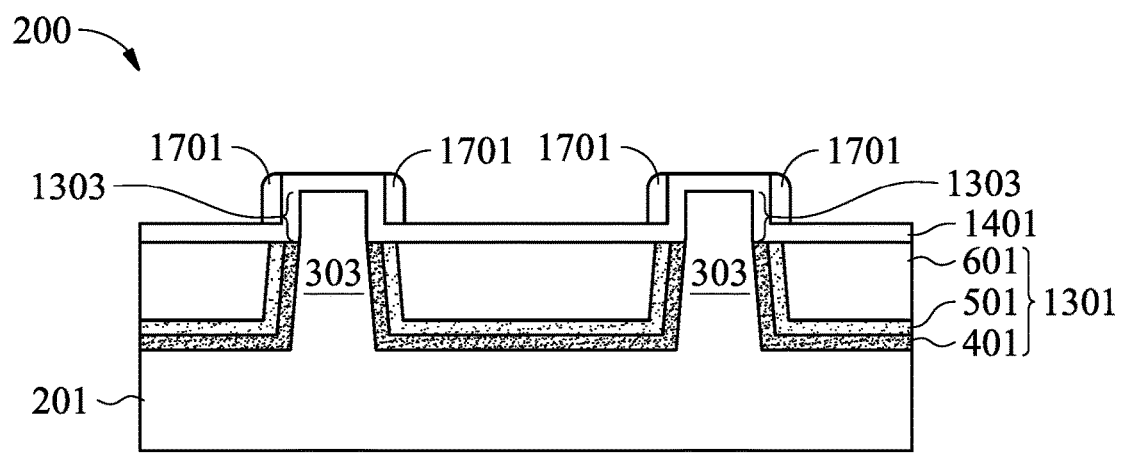

Referring next to FIGS. 17A, 17B, and 17C, horizontal portions of the dielectric layer 1601 are removed, such that remaining vertical portions of the dielectric layer 1601 form spacers 1701 on the sidewalls of the gates 1503 and the sidewalls of the fins 1303. In some embodiments, the horizontal portions of the dielectric layer 1601 may be removed using a suitable etching process, such as an anisotropic dry etching process.

Figure 18A:
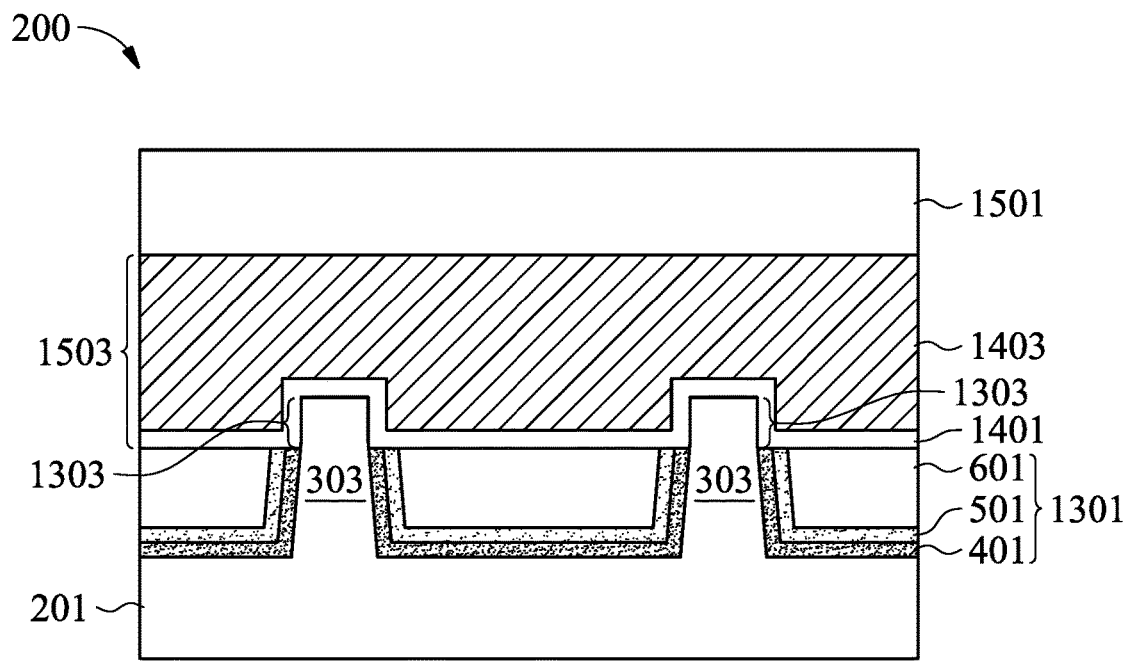
FIGS. 18A, 18B and 18C are cross-sectional views of an intermediate stage in the manufacture of a FinFET device in accordance with some embodiments.
Figure 18B:
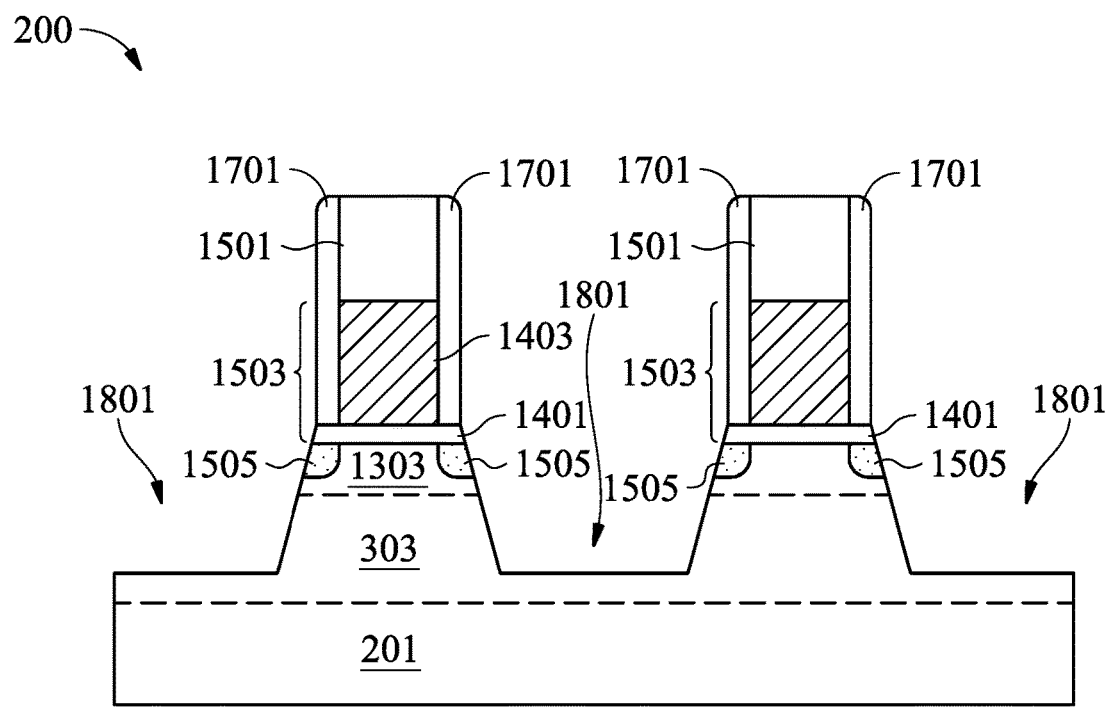
Figure 18C:
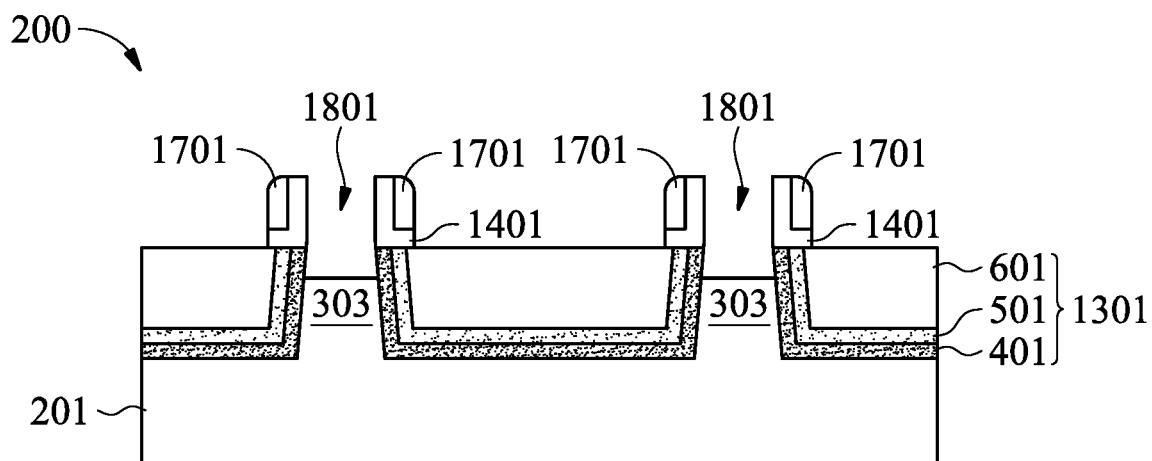

Referring to FIGS. 18A, 18B, and 18C, after forming the spacers 1701, a patterning process is performed on the fins 1303 to form recesses 1801 in the source/drain regions of the fins 1303. In some embodiments, the patterning process may include a suitable anisotropic dry etching process, while using the patterned mask 1501, the gates 1503, the spacers 1701, and/or isolation regions 1301 as a combined mask. The suitable anisotropic dry etching process may include a reactive ion etch (RIE), a neutral beam etch (NBE), a combination thereof, or the like. In some embodiments, portions of the dielectric layer 1401 may be removed over the isolation regions 1301 during the patterning process.

Figure 19A:
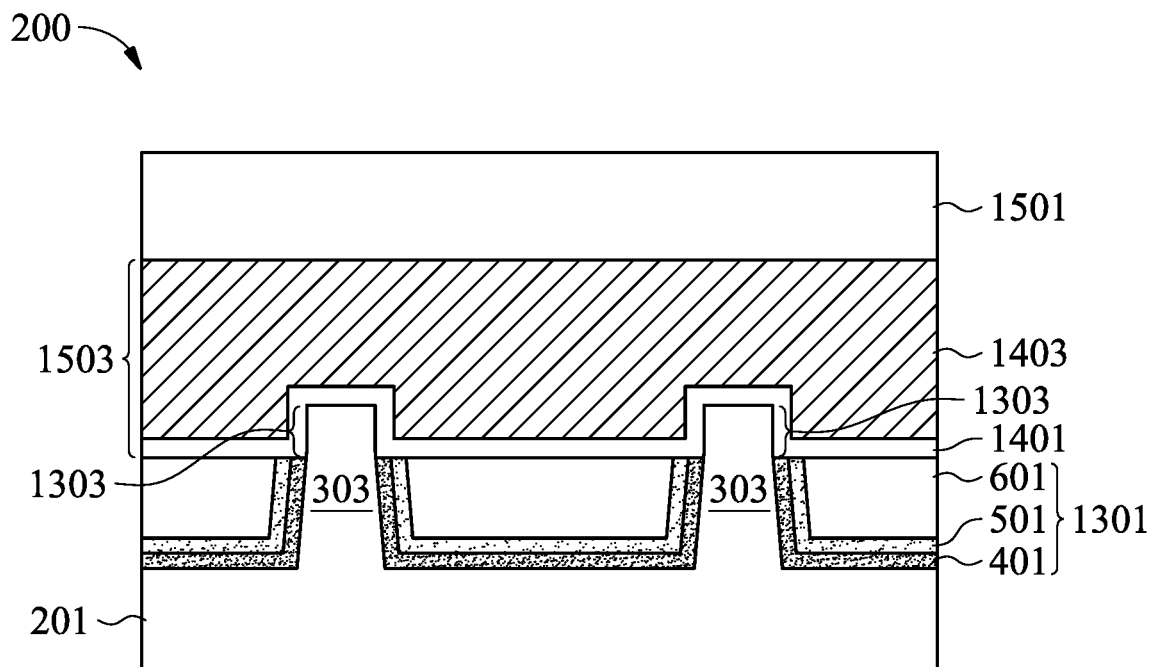
FIGS. 19A, 19B and 19C are cross-sectional views of an intermediate stage in the manufacture of a FinFET device in accordance with some embodiments.
Figure 19B:
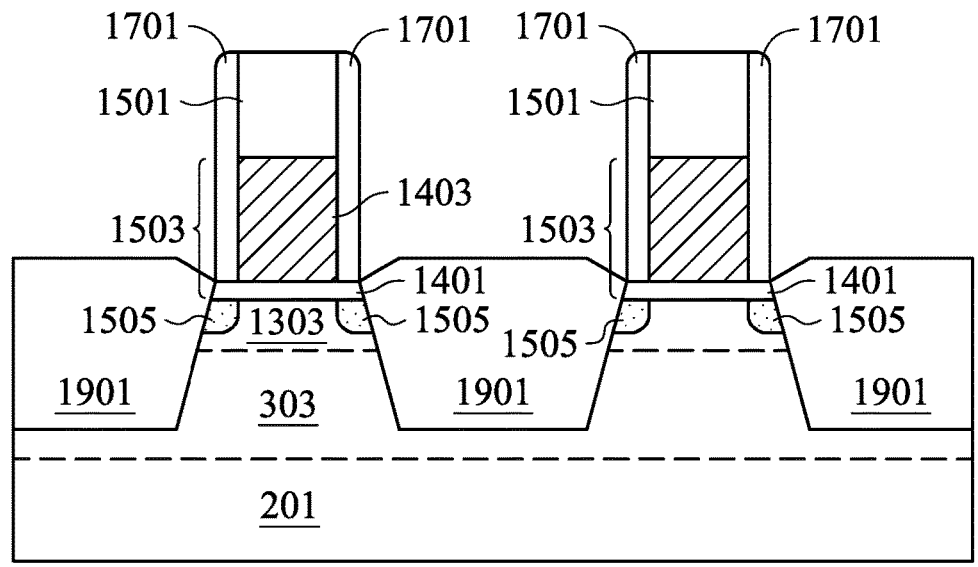
Figure 19C:
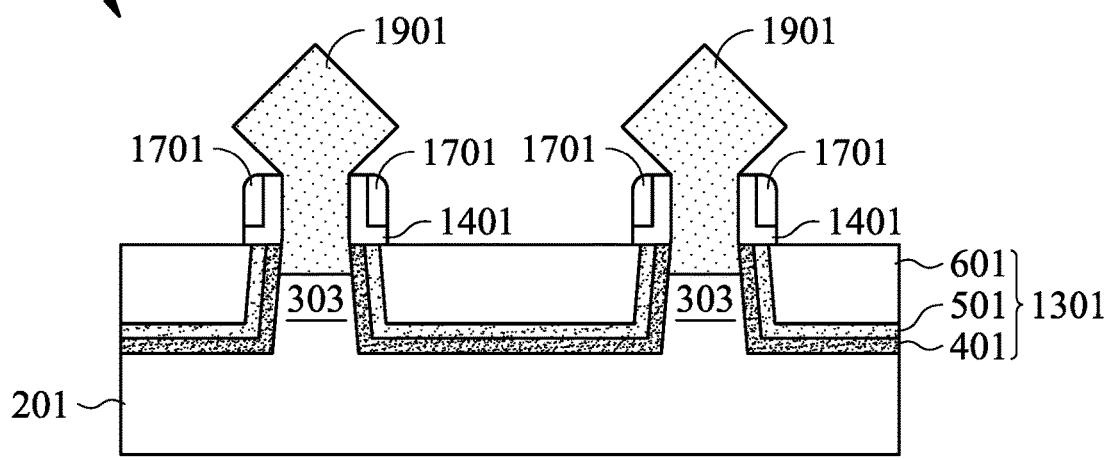

Referring to FIGS. 19A, 19B, and 19C, epitaxial source/drain regions 1901 are formed in the recesses 1801 (see FIGS. 18B and 18C). In some embodiments, the epitaxial source/drain regions 1901 are epitaxially grown in the recesses 1801 using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments where the FinFET device 200 is an n-type device and the fins 1303 are formed of silicon, the epitaxial source/drain regions 1901 may include silicon, SiC, SiCP, SiP, or the like. In some embodiments where the FinFET device 200 is a p-type device and the fins 1303 are formed of silicon, the epitaxial source/drain regions 1901 may include SiGe, SiGeB, Ge, GeSn, or the like. The epitaxial source/drain regions 1901 may have surfaces raised from respective surfaces of the fins 1303 and may have facets. In some embodiments, the epitaxial source/drain regions 1901 may extend past the fins 1303 and into the semiconductor strips 303. In some embodiments, the material of the epitaxial source/drain regions 1901 may be implanted with suitable dopants. In some embodiments, the implantation process is similar to the process used for forming the LLD regions 1505 as described above with reference to FIGS. 15A, 15B, and 15C, and the description is not repeated herein. In other embodiments, the material of the epitaxial source/drain regions 1901 may be in situ doped during growth.

Figure 20C:
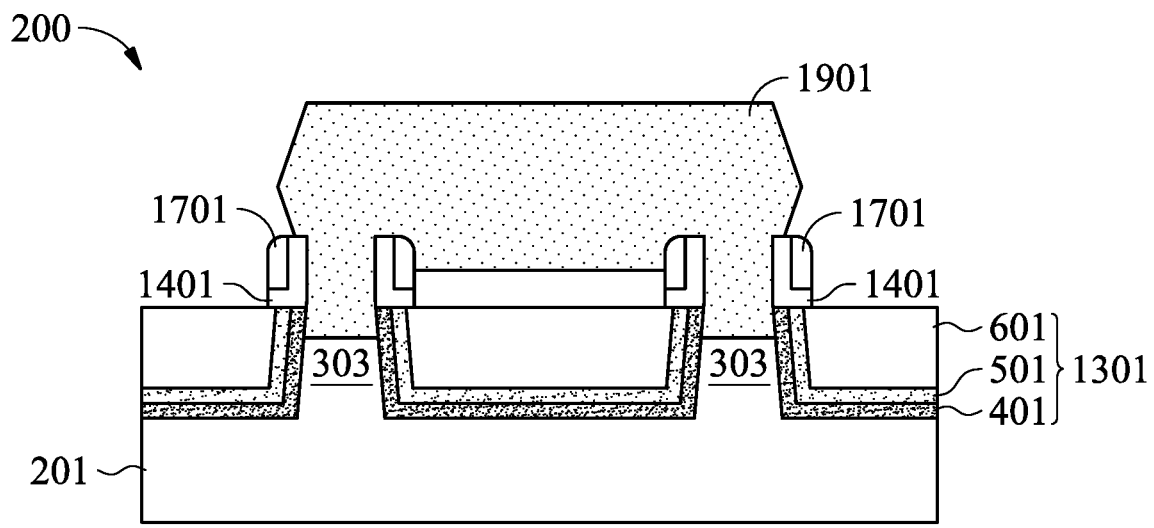
FIG. 20C is a cross-sectional view of an intermediate stage in the manufacture of a FinFET device in accordance with some embodiments.

Referring further to FIGS. 19A, 19B, and 19C, in the illustrated embodiment, each of the epitaxial source/drain regions 1901 are physically separated from other epitaxial source/drain regions 1901. In other embodiments, adjacent epitaxial source/drain regions 1901 may be merged. Such an embodiment is depicted in FIG. 20C, where adjacent epitaxial source/drain regions 1901 are merged to form a common epitaxial source/drain region 1901.

Figure 21A:
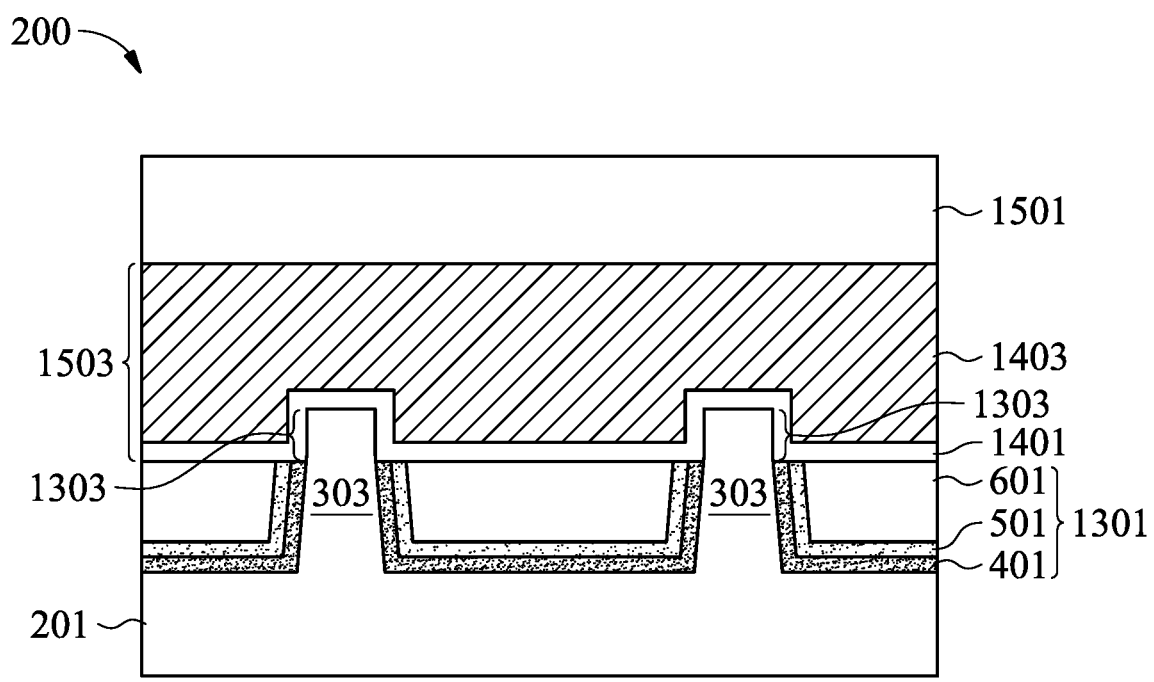
FIGS. 21A, 21B and 21C are cross-sectional views of an intermediate stage in the manufacture of a FinFET device in accordance with some embodiments.
Figure 21B:
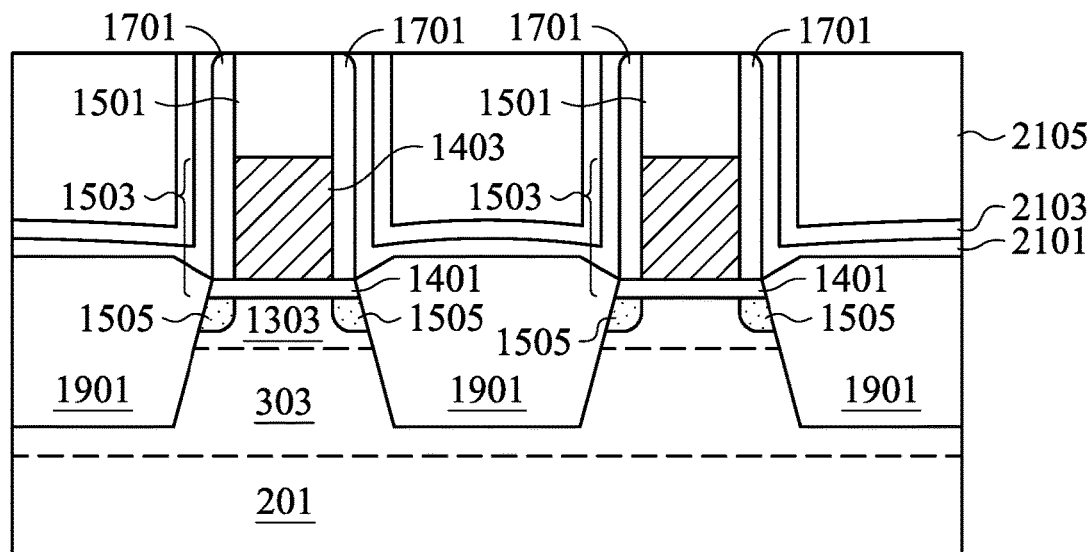
Figure 21C:
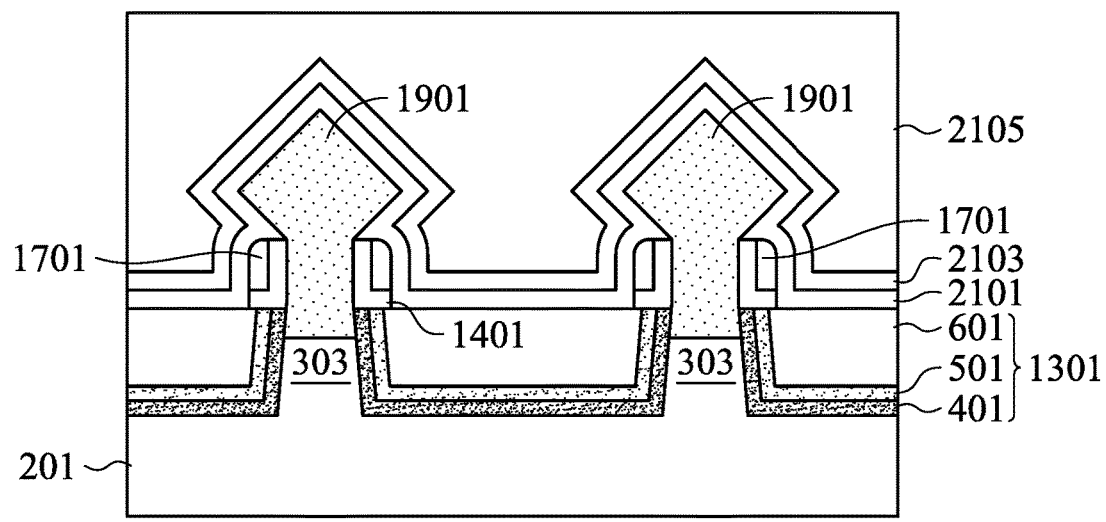

Referring to FIGS. 21A, 21B and 21C, a dielectric gap-filling process is performed to fill gaps between adjacent gates 1503 and gaps between adjacent epitaxial source/drain regions 1901 with one or more dielectric materials. The dielectric gap-filling process includes forming a conformal liner layer 2101 over the gates 1503 and the epitaxial source/drain regions 1901, forming a precursor soak layer 2103 over the liner layer 2101, and forming a dielectric layer 2105 over the precursor soak layer 2103. In some embodiments, the liner layer 2101 may be formed using similar materials and methods as the liner layer 401 described above with reference to FIG. 4A and the description is repeated herein. In some embodiments, the precursor soak layer 2103 may be formed using similar materials and methods as the precursor soak layer 501 described above with reference to FIG. 5A and the description is repeated herein. In some embodiments, the dielectric layer 2105 is formed of a dielectric material such as silicon oxide, SiOC, $ZrO_2$, $HfO_2$, Phospho-Silicate Glass (PSG), Boro-Silicate Glass (BSG), Boron-Doped Phospho-Silicate Glass (BPSG), undoped Silicate Glass (USG), low-k dielectric materials, extremely low-k dielectric materials, high-k dielectric materials, a combination thereof, or the like, and may be deposited by any suitable method, such as ALD, CVD, PECVD, a spin-on-glass process, a combination thereof, or the like. The dielectric layer 2105 may also be referred to as an interlayer dielectric (ILD) layer. In some embodiments, the liner layer 2101 is used as an etch stop layer while patterning the dielectric layer 2105 to form openings for subsequently formed contact plugs. Accordingly, a material for the liner layer 2101 may be chosen such that the material of the liner layer 2101 has a lower etch rate than the material of the dielectric layer 2105.

In some embodiments, the dielectric gap-filling process for forming the liner layer 2101, the precursor soak layer 2103, and the dielectric layer 2105 may comprise the dielectric gap-filling process 700 described above with reference to FIG. 7 and the description is not repeated herein. In other embodiments, the dielectric gap-filling process for forming the liner layer 2101, the precursor soak layer 2103, and the dielectric layer 2105 may comprise the dielectric gap-filling process 800 described above with reference to FIG. 8 and the description is not repeated herein. In yet other embodiments, the dielectric gap-filling process for forming the liner layer 2101, the precursor soak layer 2103, and the dielectric layer 2105 may comprise the dielectric gap-filling process 900 described above with reference to FIG. 9 and the description is not repeated herein. In yet other embodiments, the dielectric gap-filling process for forming the liner layer 2101, the precursor soak layer 2103, and the dielectric layer 2105 may comprise the dielectric gap-filling process 1000 described above with reference to FIG. 10 and the description is not repeated herein. In some embodiments, a planarization process, such as a CMP process, may be performed to level the top surface of the dielectric layer 2105 with the top surfaces of the patterned mask 1501.

Figure 22A:
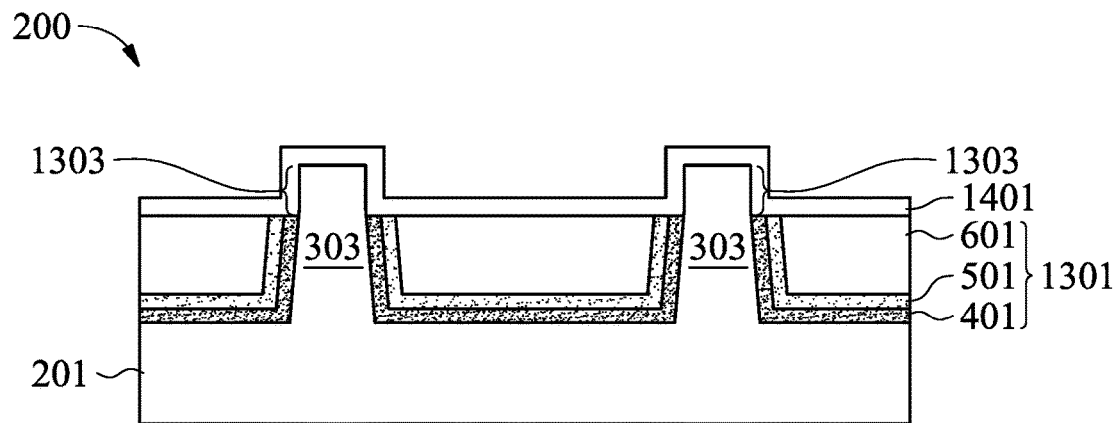
FIGS. 22A, 22B and 22C are cross-sectional views of an intermediate stage in the manufacture of a FinFET device in accordance with some embodiments.
Figure 22B:
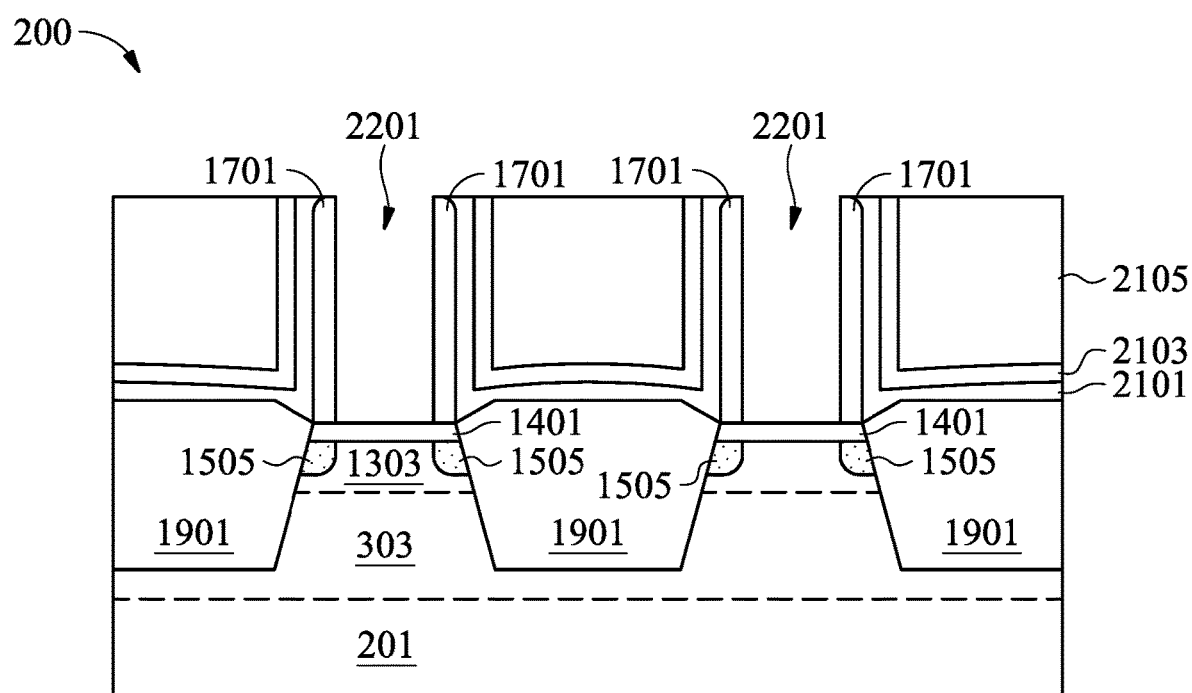
Figure 22C:
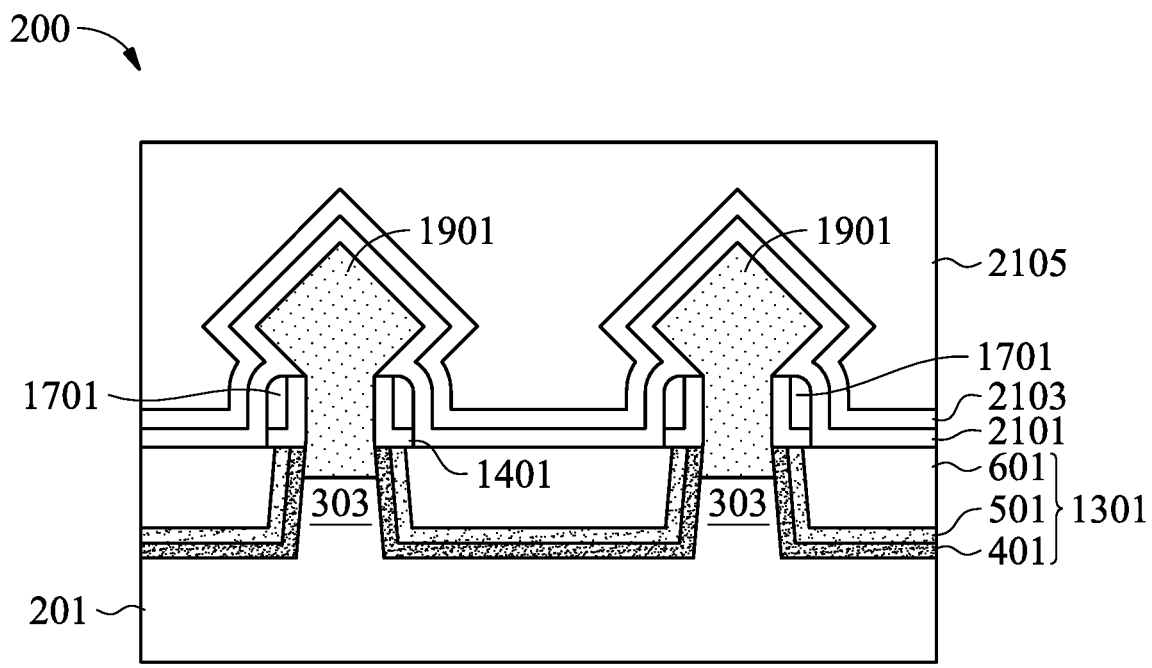

Referring to FIGS. 22A, 22B and 22C, the gates 1503 (see FIGS. 21A and 21B) are removed to form recesses 2201. In some embodiments, the gates 1503 may be removed using one or more suitable etching processes. Each of the recesses 2201 exposes a channel region of a respective fin 1303. In some embodiments, the dielectric layer 1401 may be used as an etch stop layer when the gates 1503 are etched. In some embodiments, after removing the gate electrode layers 1403 of the gates 1503, exposed portions of the dielectric layer 1401 may be also removed. In some embodiments, the exposed portions of the dielectric layer 1401 may remain in the recesses 2201.

Figure 23A:
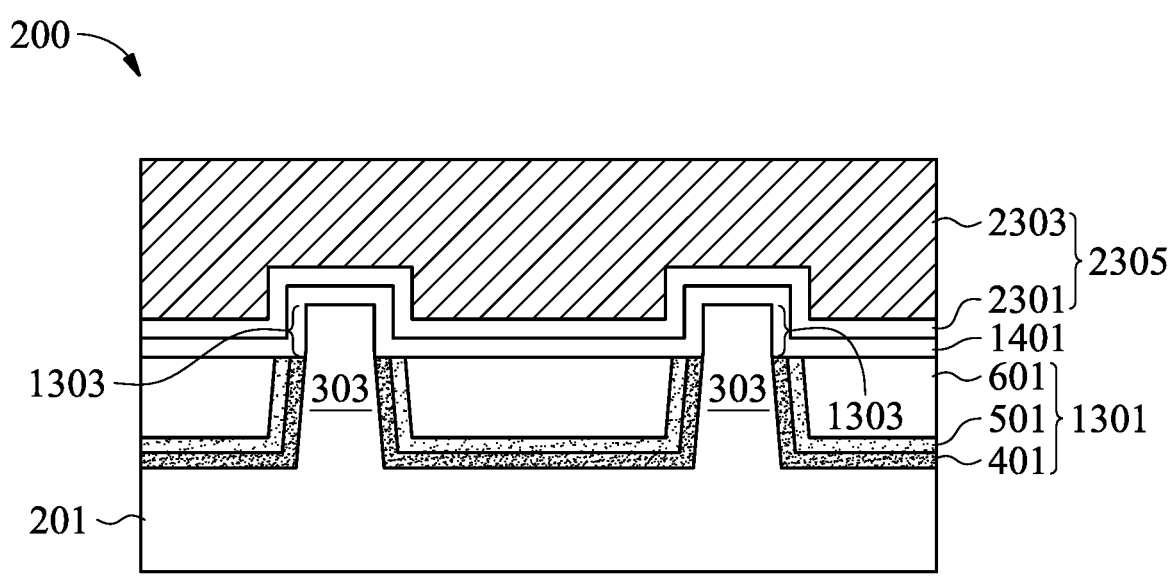
FIGS. 23A, 23B and 23C are cross-sectional views of an intermediate stage in the manufacture of a FinFET device in accordance with some embodiments.
Figure 23B:
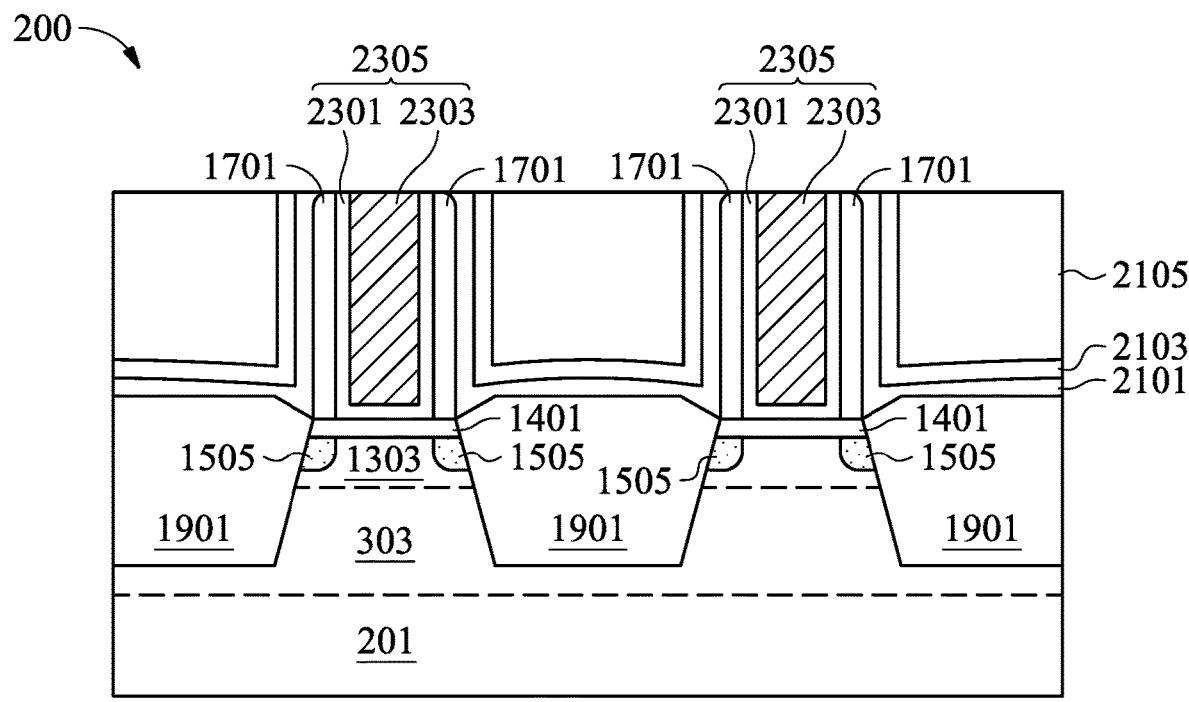
Figure 23C:
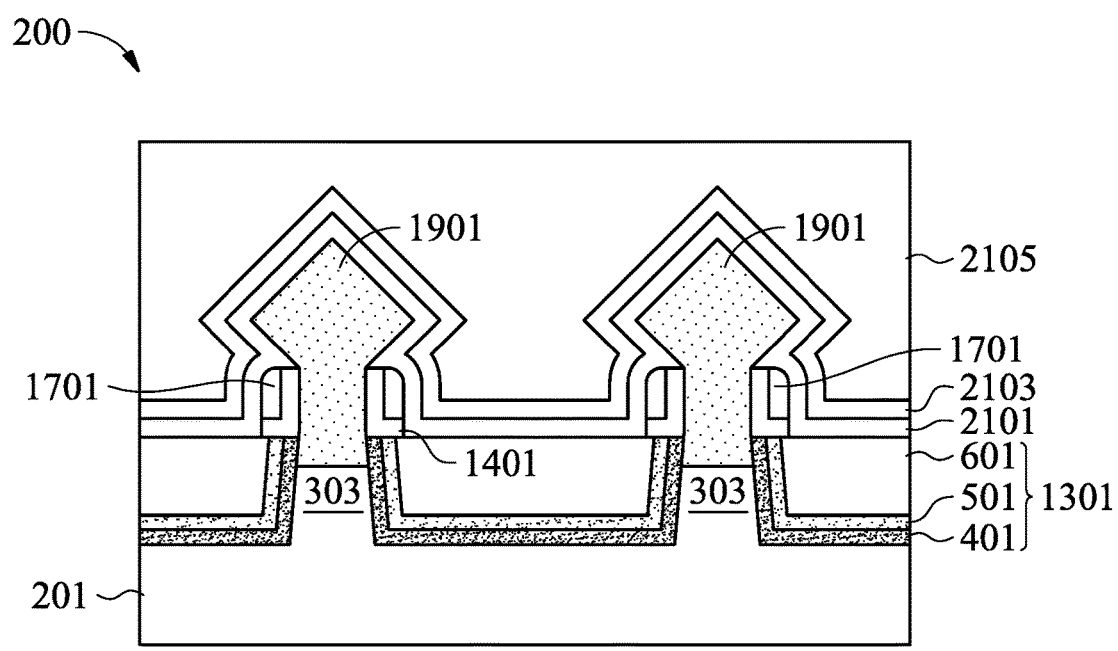

Referring to FIGS. 23A, 23B and 23C, a gate dielectric layer 2301 and a gate electrode layer 2303 are formed in the recesses 2201 (see FIGS. 22A and 22B). In some embodiments, the gate dielectric layer 2301 is conformally deposited in the recesses 2201. In some embodiments, the gate dielectric layer 2301 comprises silicon oxide, silicon nitride, or multilayers thereof. In other embodiments, the gate dielectric layer 2301 includes a high-k dielectric material, and in these embodiments, the gate dielectric layer 2301 may have a k value greater than about 7.0, and may include a metal oxide or a silicate of Hf, Al, Zr, La, Mg, Ba, Ti, Pb, and combinations thereof. The formation methods of the gate dielectric layer 2301 may include Molecular-Beam Deposition (MBD), ALD, PECVD, a combination thereof, or the like.

Referring further to 23A, 23B and 23C, in some embodiments where the portions of the dielectric layer 1401 are not removed over the channel regions of the fins 1303 while forming the recesses 2201 (see FIGS. 22A and 22B), the portions of the dielectric layer 1401 over the channel regions of the fins 1303 may act as interfacial layers between the gate dielectric layer 2301 and the channel regions of the fins 1303. In some embodiments where the portions of the dielectric layer 1401 are removed over the channel regions of the fins 1303 while forming the recesses 2201, one or more interfacial layers may be formed over the channel regions of the fins 1303 prior to forming the gate dielectric layer 2301, and the gate dielectric layer 2301 is formed over the one or more interfacial layers. The interfacial layers help to buffer the subsequently formed high-k dielectric layer from the underlying semiconductor material. In some embodiments, the interfacial layers comprise a chemical silicon oxide, which may be formed of chemical reactions. For example, a chemical oxide may be formed using deionized water+ozone ($O_3$), $NH_4OH+H_2O_2+H_2O$ (APM), or other methods. Other embodiments may utilize a different material or processes (e.g., a thermal oxidation or a deposition process) for forming the interfacial layers.

Next, the gate electrode layer 2303 is deposited over the gate dielectric layer 2301 and fills the remaining portions of the recesses 2201 (see FIGS. 22A and 22B). In some embodiments, the gate electrode layer 2303 may comprise one or more layers of suitable conductive materials. The gate electrode layer 2303 may comprise a metal selected from a group of W, Cu, Ti, Ag, Al, TiAl, TiAlN, TaC, TaCN, TaSiN, Mn, Co, Pd, Ni, Re, Ir, Ru, Pt, Zr, and combinations thereof. In some embodiments, the gate electrode layer 2303 may comprise a material selected from a group of TiN, WN, TaN, Ru, and combinations thereof. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. The gate electrode layer 2303 may be formed using a suitable process such as ALD, CVD, PVD, plating, combinations thereof, or the like. After filling the recesses 2201 with the gate electrode layer 2303, a planarization process, such as a CMP process, may be performed to remove the excess portions of the gate dielectric layer 2301 and the gate electrode layer 2303, which excess portions are over the top surface of the dielectric layer 2105. The remaining portions of the gate electrode layer 2303 and the gate dielectric layer 2301 thus form replacement gates 2305 of the FinFET device 200. In other embodiments, the gates 1503 (see FIGS. 21A and 21B) may remain rather than being replaced by the replacement gates 2305.

Figure 24A:
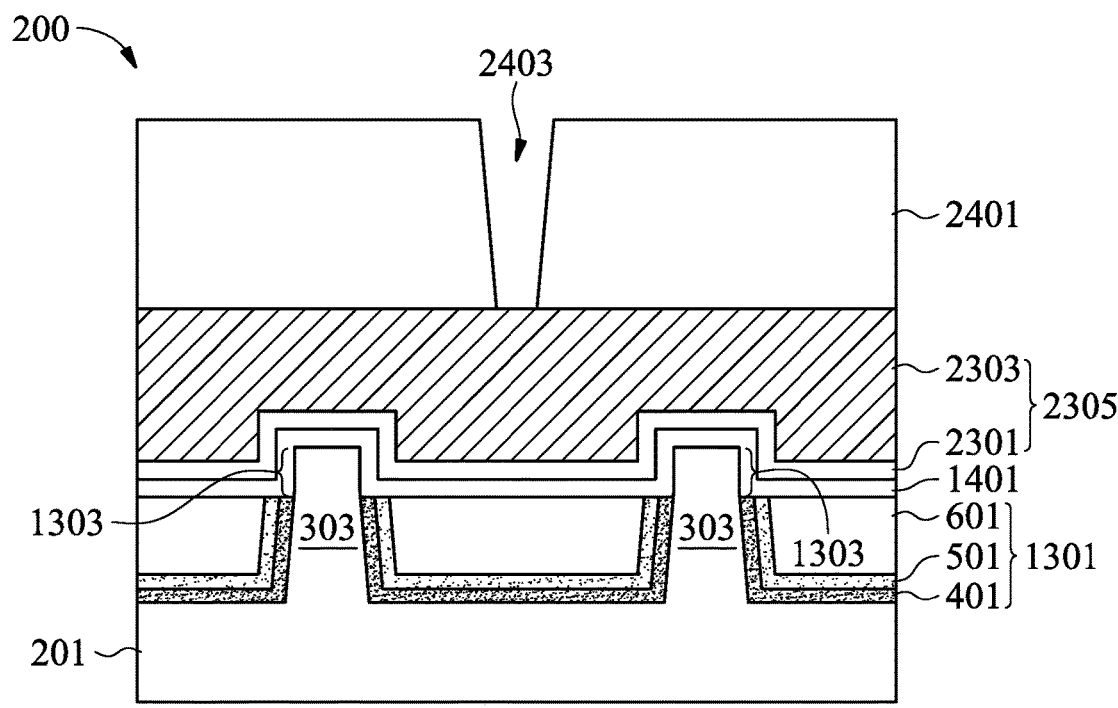
FIGS. 24A, 24B and 24C are cross-sectional views of an intermediate stage in the manufacture of a FinFET device in accordance with some embodiments.
Figure 24B:
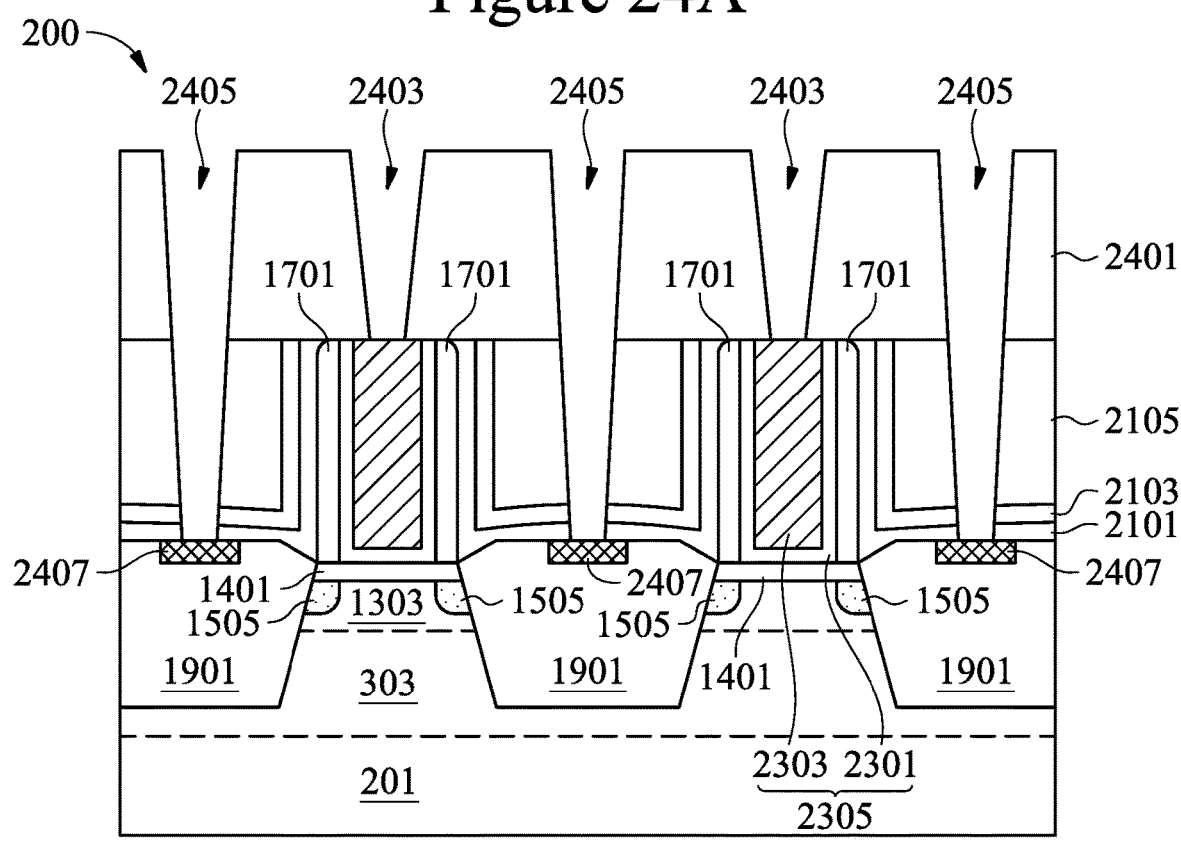
Figure 24C:
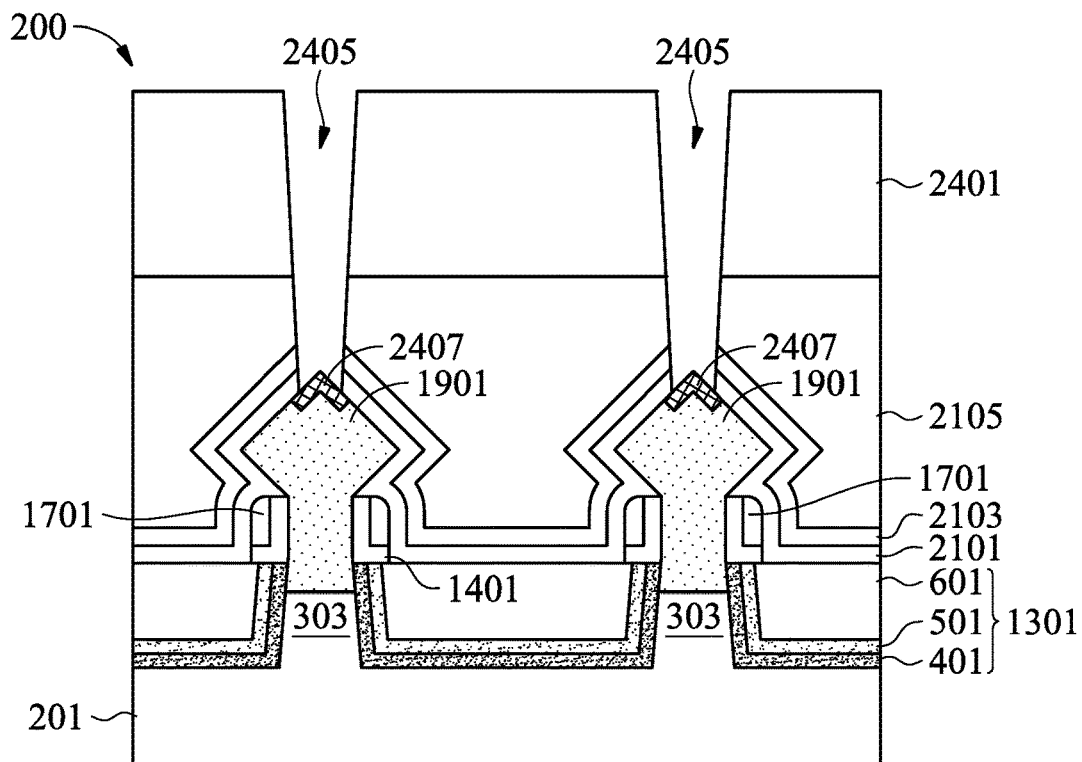

Referring to FIGS. 24A, 24B and 24C, a dielectric layer 2401 is formed over the dielectric layer 2105 and the replacement gates 2305. The dielectric layer 2401 may also be referred to as an interlayer dielectric (ILD) layer. In some embodiments, the dielectric layer 2401 may be formed using similar materials and methods as the dielectric layer 2105 described above with reference to FIGS. 21A, 21B and 21C, and the description is not repeated herein. In some embodiments, the dielectric layer 2105 and the dielectric layer 2401 are formed of a same material. In other embodiments, the dielectric layer 2105 and the dielectric layer 2401 are formed of different materials. The liner layer 2101, the precursor soak layer 2103, and the dielectric layers 2105 and 2401 are patterned to form openings 2403 and 2405. In some embodiments, the liner layer 2101, the precursor soak layer 2103, and the dielectric layers 2105 and 2401 may be patterned using one or more suitable etching processes, such as anisotropic dry etching process, or the like. The openings 2403 expose the respective replacement gates 2305. The openings 2405 expose portions of the respective epitaxial source/drain regions 1901.

Referring further to FIGS. 24A, 24B and 24C, self-aligned silicide (salicide) layers 2407 are formed through the openings 2405. In some embodiments, a metallic material is deposited in the openings 2405. The metallic material may comprise Ti, Co, Ni, NiCo, Pt, NiPt, Ir, PtIr, Er, Yb, Pd, Rh, Nb, a combination thereof, or the like, and may be formed using PVD, sputtering, or the like. Subsequently, an annealing process is performed to form the salicide layers 2407. In some embodiments where the epitaxial source/drain regions 1901 comprise silicon, the annealing process causes the metallic material to react with silicon to form a silicide of the metallic material.

Figure 25A:
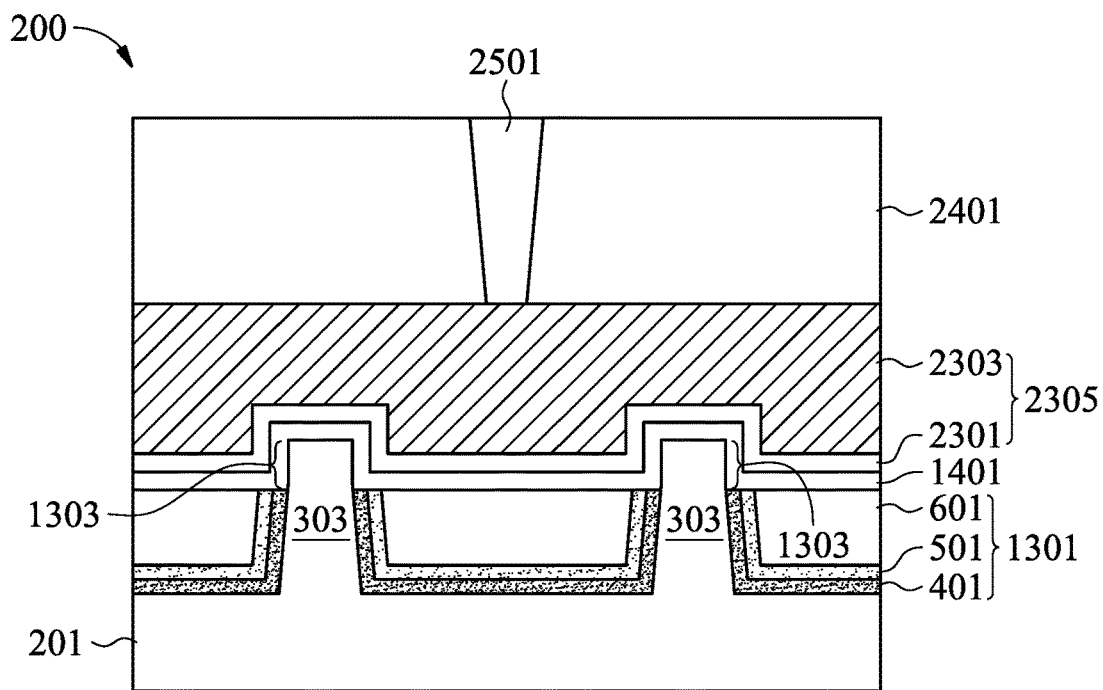
FIGS. 25A, 25B and 25C are cross-sectional views of an intermediate stage in the manufacture of a FinFET device in accordance with some embodiments.
Figure 25B:
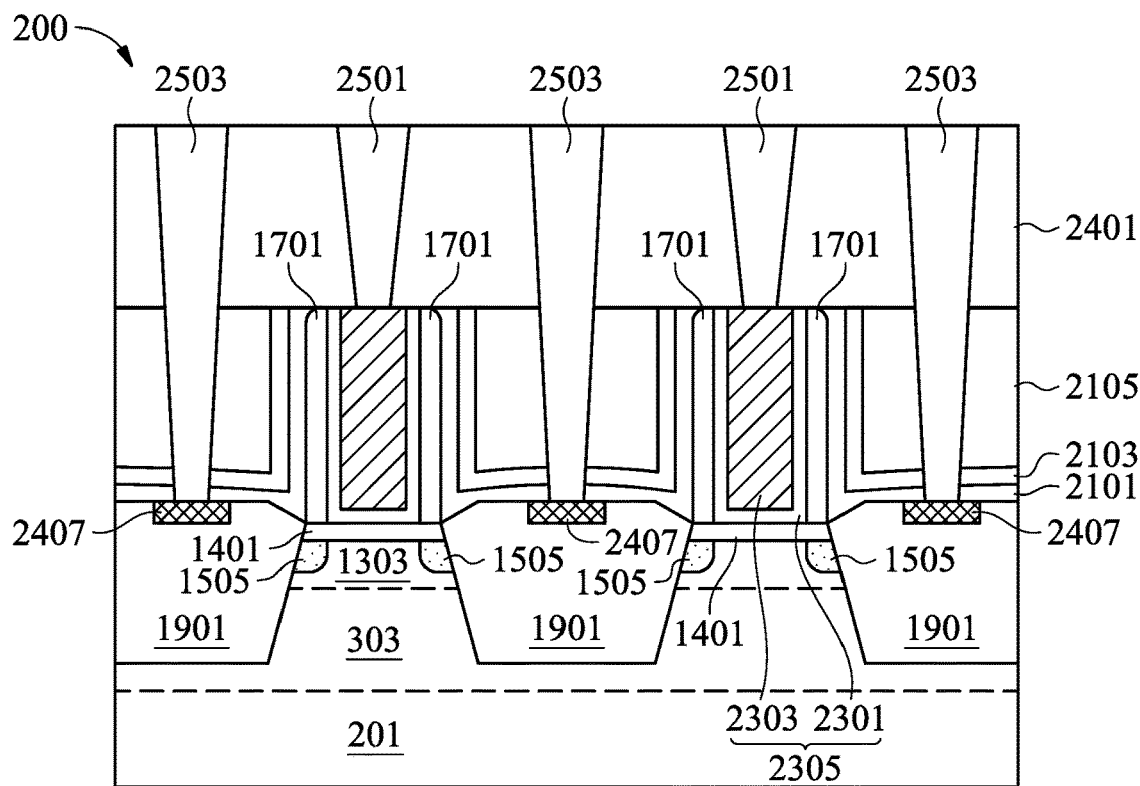
Figure 25C:
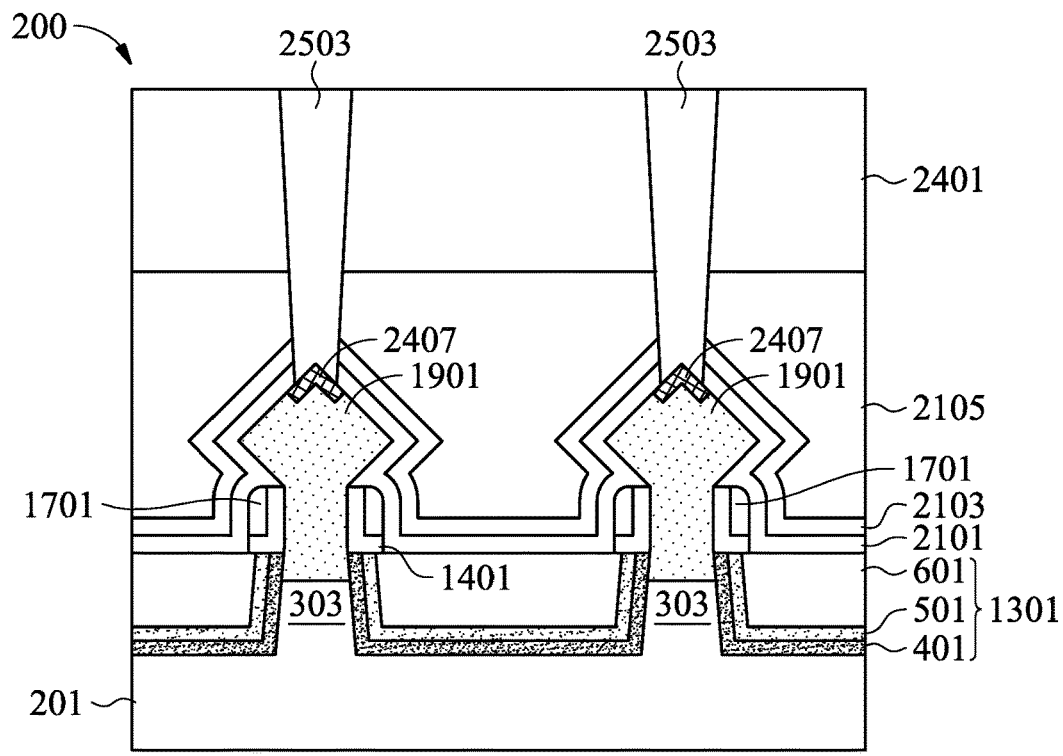

Referring to FIGS. 25A, 25B and 25C, contact plugs 2501 are formed in the openings 2403 (see FIGS. 24A and 24B) and contact plug 2503 are formed in the opening 2405 (see FIGS. 24B and 24C). In some embodiments, a liner, such as a diffusion barrier layer, an adhesion layer, or the like, and a conductive material are deposited in the openings 2403 and 2405. The liner may include titanium, titanium nitride, tantalum, tantalum nitride, a combination thereof, or the like. Subsequently, the openings 2403 and 2405 are filled with the conductive material. The conductive material may be copper, a copper alloy, silver, gold, tungsten, aluminum, nickel, a combination thereof, or the like. A planarization process, such as a CMP process, may be performed to remove excess materials from a top surface of the dielectric layer 2401. The remaining portions of the liner and the conductive material form the contact plugs 2501 and 2503. The contact plugs 2501 are physically and electrically coupled to the replacement gates 2305. The contact plugs 2503 are physically and electrically coupled to the epitaxial source/drain regions 1901 through the salicide layers 2407.

Figure 26A:
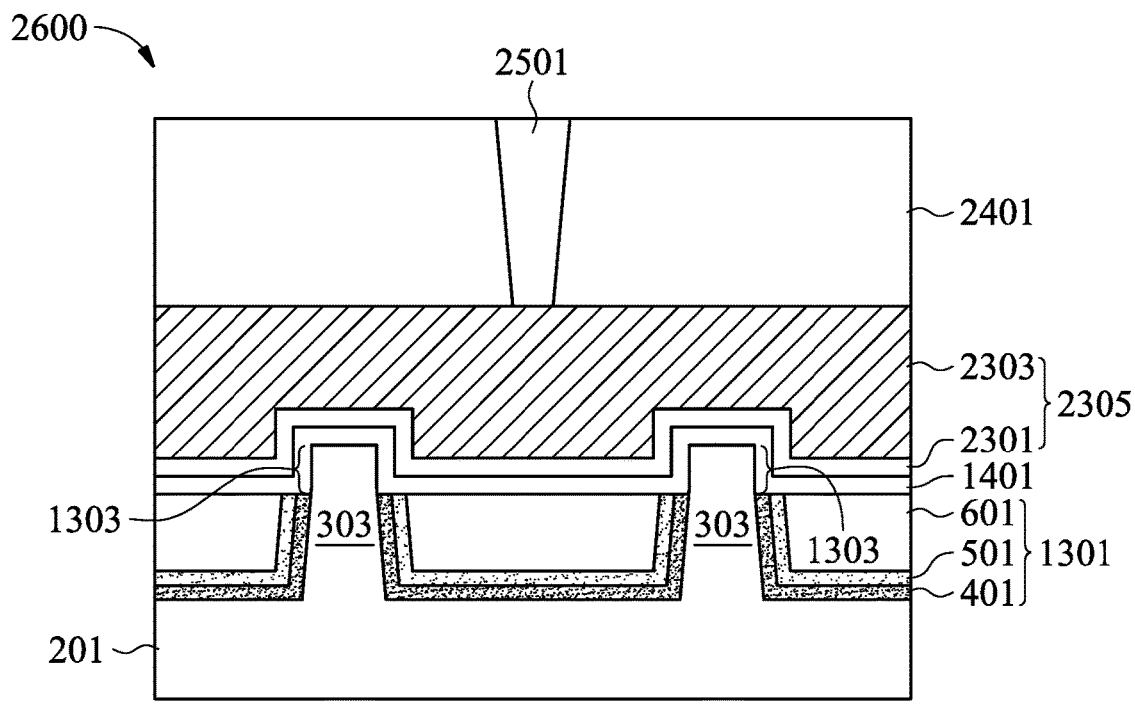
FIGS. 26A, 26B and 26C are cross-sectional views of a FinFET device in accordance with some embodiments.
Figure 26B:
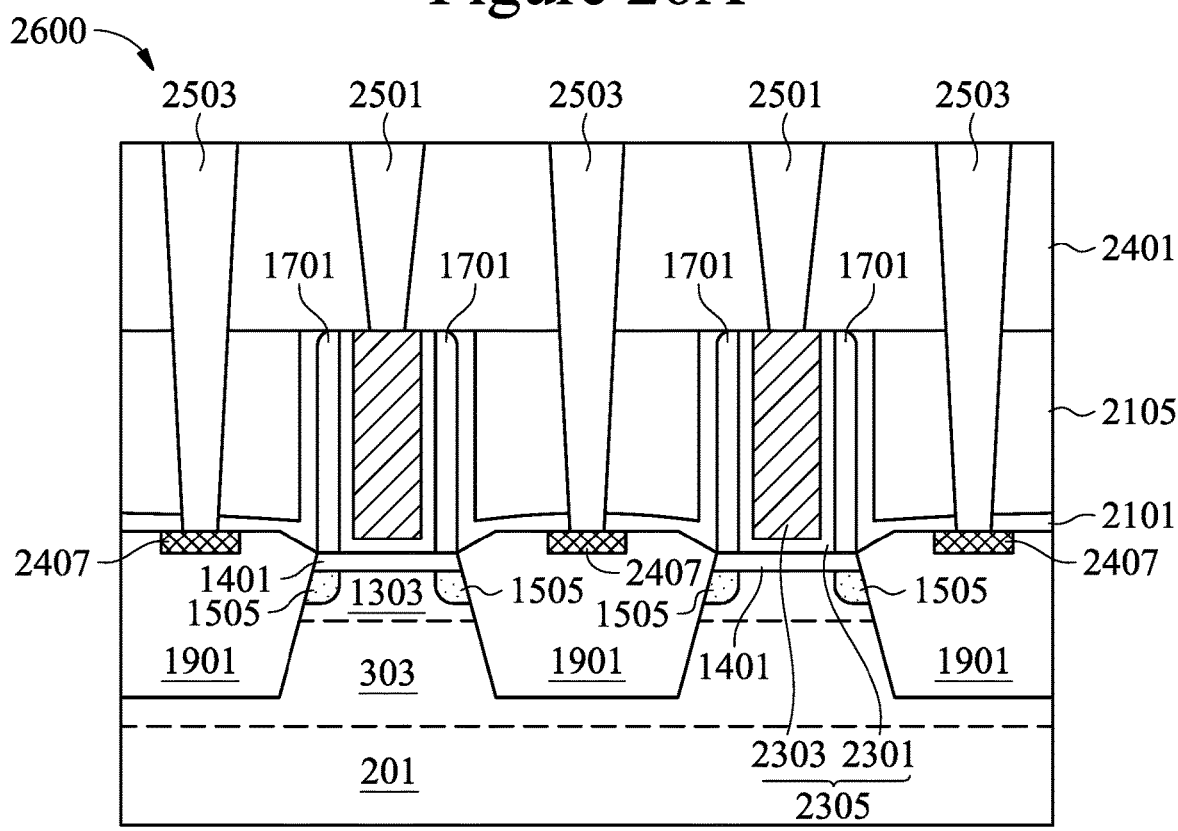
Figure 26C:
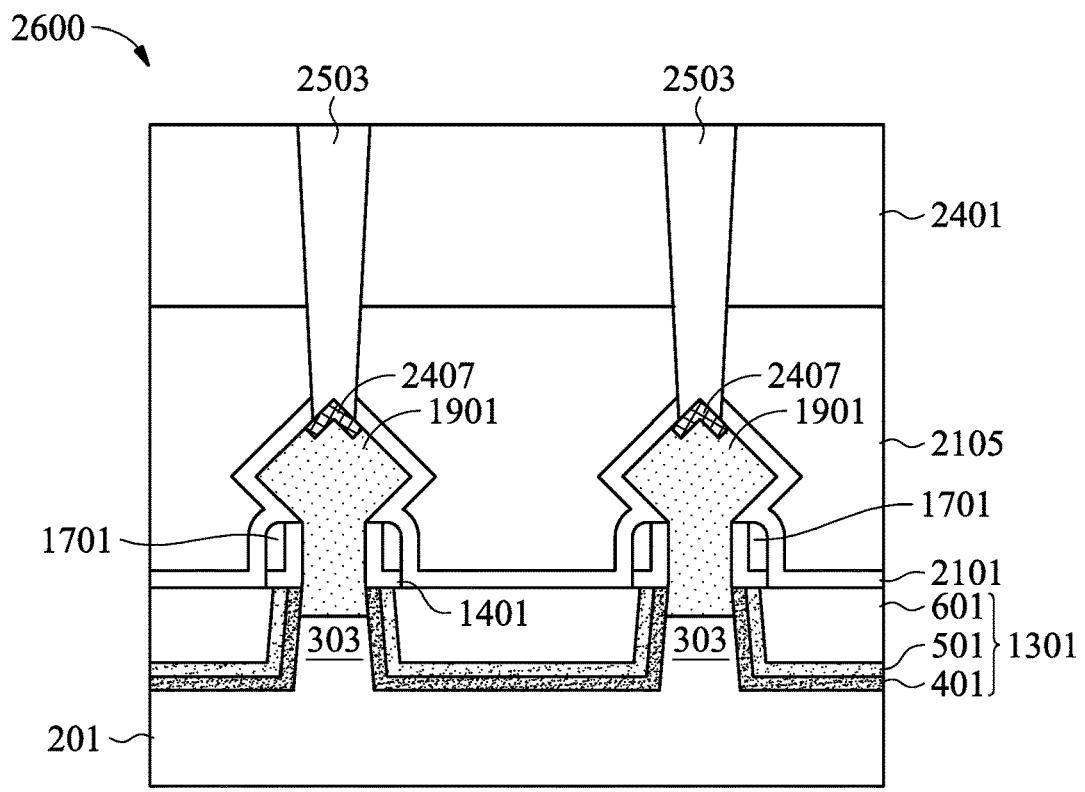

FIGS. 26A, 26B and 26C are cross-sectional views of a FinFET device 2600 in accordance with some embodiments. To highlight differences between the FinFET device 2600 and the FinFET device 200 illustrated in FIGS. 25A, 25B and 25C, the common features of these FinFET devices are labeled by same numerical references and their description is not repeated herein. In some embodiments, the FinFET device 2600 may be formed using a similar method as the FinFET device 200, and the description is not repeated herein. In the illustrated embodiment, the formation of the precursor soak layer 2103 (see FIGS. 21A, 21B, and 21C) is omitted and the dielectric layer 2105 is formed directly on the liner layer 2101.

Figure 27A:
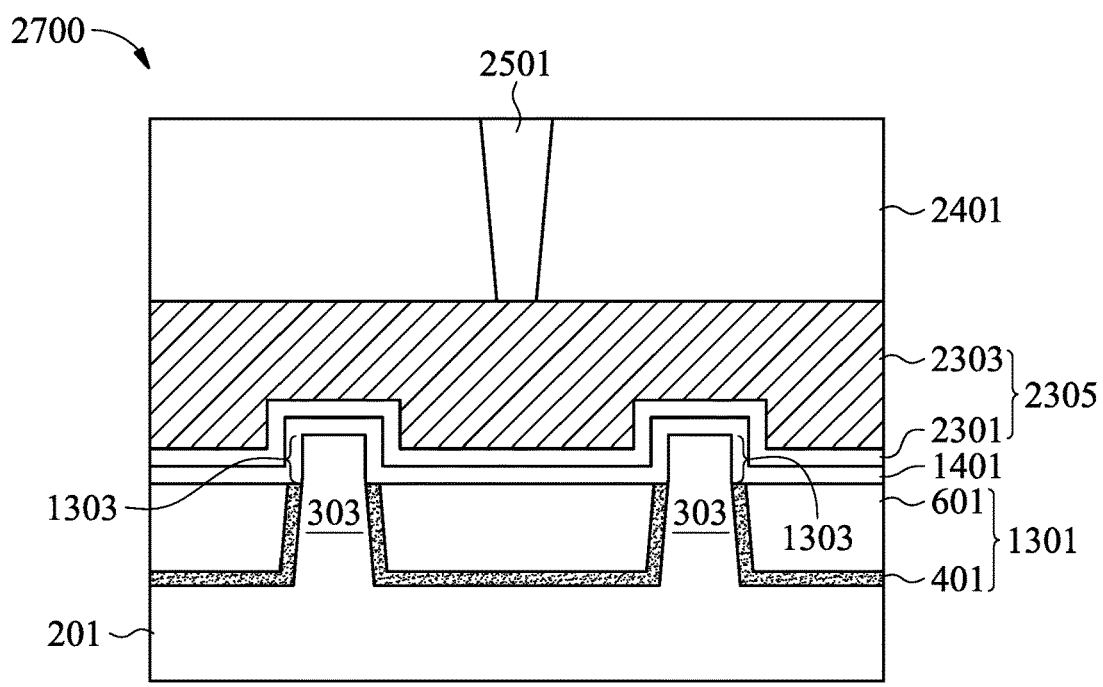
FIGS. 27A, 27B and 27C are cross-sectional views of a FinFET device in accordance with some embodiments.
Figure 27B:
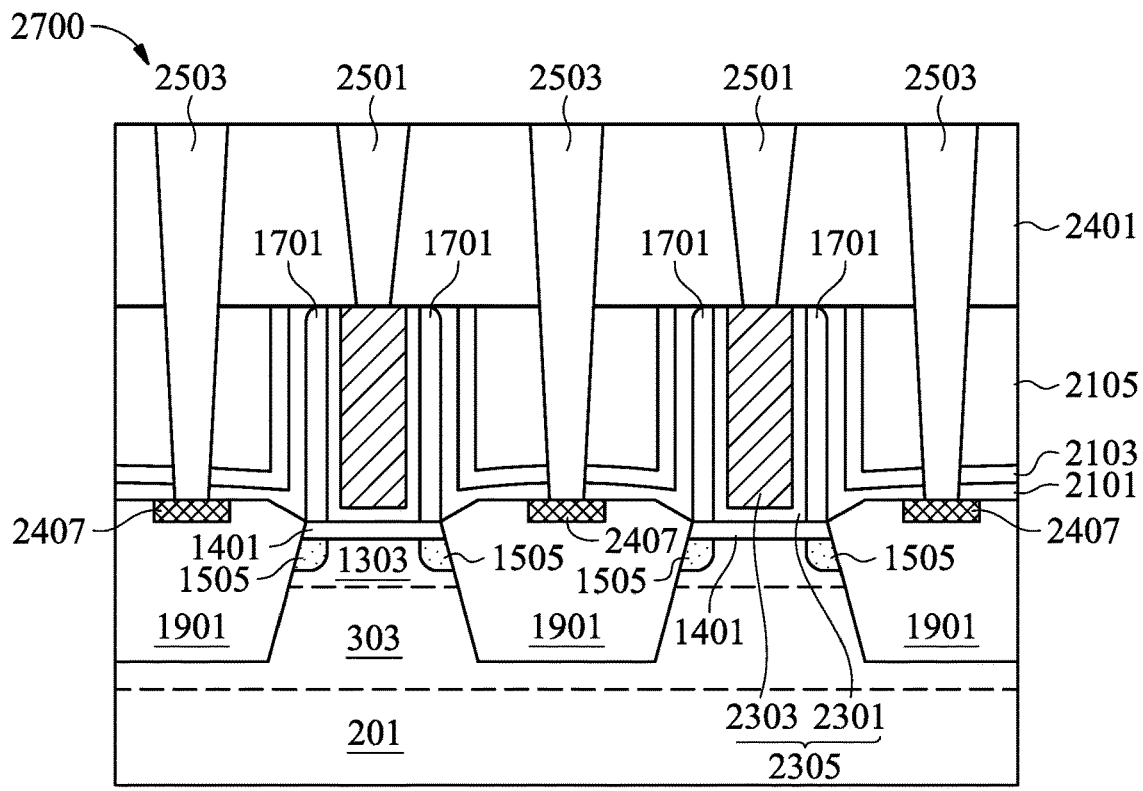
Figure 27C:
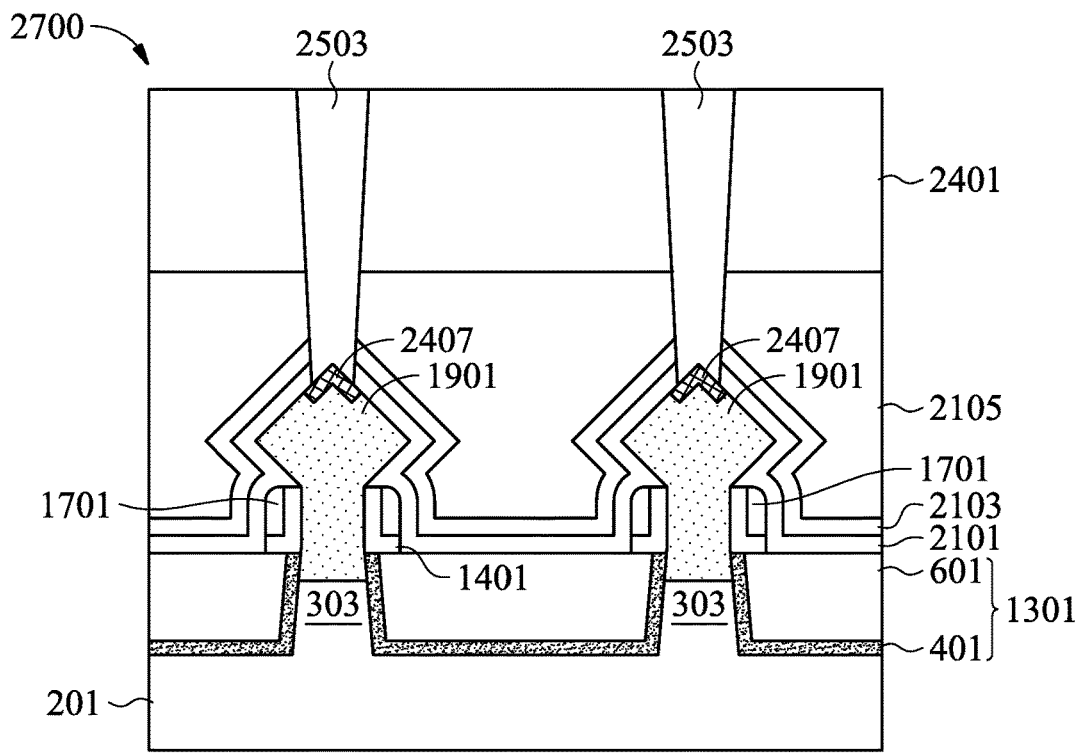

FIGS. 27A, 27B and 27C are cross-sectional views of a FinFET device 2700 in accordance with some embodiments. To highlight differences between the FinFET device 2700 and the FinFET device 200 illustrated in FIGS. 25A, 25B and 25C, the common features of these FinFET devices are labeled by same numerical references and their description is not repeated herein. In some embodiments, the FinFET device 2700 may be formed using a similar method as the FinFET device 200, and the description is not repeated herein. In the illustrated embodiment, the formation of the precursor soak layer 501 (see FIG. 5A) is omitted and the dielectric layer 601 is formed directly on the liner layer 401.

Figure 28:
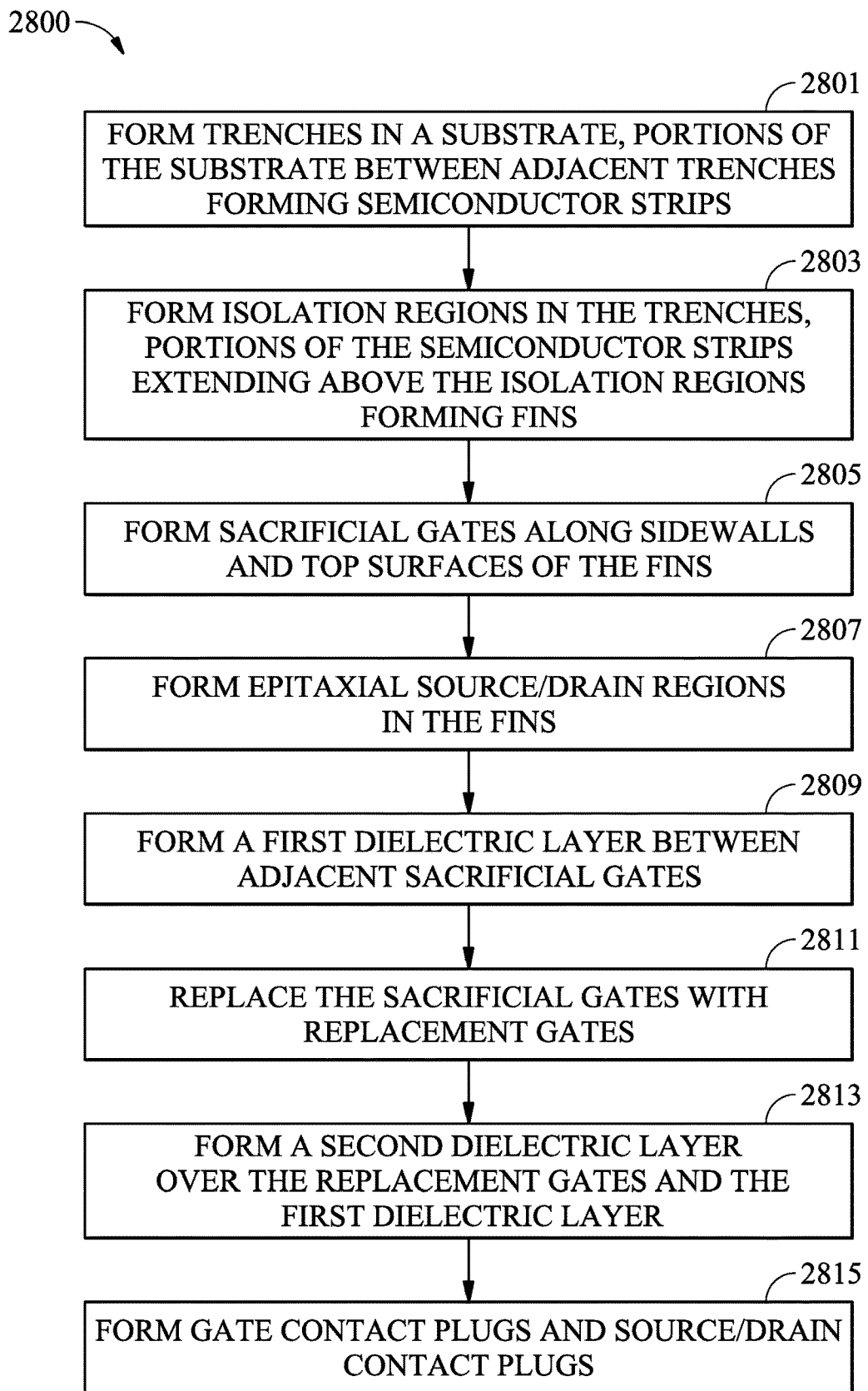
FIG. 28 is a flow diagram illustrating a method of forming a FinFET device in accordance with some embodiments.

FIG. 28 is a flow diagram illustrating a method 2800 of forming a FinFET device in accordance with some embodiments. The method 2800 starts with step 2801, where trenches (such as, for example, the trenches 301 illustrated in FIG. 3A) are formed in a substrate (such as, for example, the substrate 201 illustrated in FIG. 3A) such that portions of the substrate between adjacent trenches form semiconductor strips (such as, for example, the semiconductor strips 303 illustrated in FIG. 3A) as described above with reference to FIGS. 2A and 3A. In step 2803, isolation regions (such as, for example, the isolation regions 1301 illustrated in FIG. 13A) are formed in the trenches such that portions of the semiconductor strips extending above the isolation regions form the fins (such as, for example, the fins 1303 illustrated in FIG. 13A) as described above with reference to FIGS. 4A-6A, 12A and 13. In some embodiments, step 2803 may comprise performing the dielectric gap-filling process 700 described above with reference to FIG. 7. In other embodiments, step 2803 may comprise performing the dielectric gap-filling process 800 described above with reference to FIG. 8. In yet other embodiments, step 2803 may comprise performing the dielectric gap-filling process 900 described above with reference to FIG. 9. In yet other embodiments, step 2803 may comprise performing the dielectric gap-filling process 1000 described above with reference to FIG. 10. In step 2805, sacrificial gates (such as, for example, the gates 1503 illustrated in FIGS. 15A and 15B) are formed along sidewalls and top surfaces of the fins as described above with reference to FIGS. 14A, 14B and 15A-15C. In step 2807, epitaxial source/drain regions (such as, for example, the epitaxial source/drain regions 1901 illustrated in FIGS. 19B and 19C) are formed in the fins as described above with reference to FIGS. 18A-18C and 19A-19C. In step 2809, a first dielectric layer (such as, for example, the dielectric layer 2105 illustrated in FIGS. 21B and 21C) is formed between adjacent sacrificial gate structures as described above with reference to FIGS. 21A-21C. In some embodiments, step 2809 may comprise performing the dielectric gap-filling process 700 described above with reference to FIG. 7. In other embodiments, step 2809 may comprise performing the dielectric gap-filling process 800 described above with reference to FIG. 8. In yet other embodiments, step 2809 may comprise performing the dielectric gap-filling process 900 described above with reference to FIG. 9. In yet other embodiments, step 2809 may comprise performing the dielectric gap-filling process 1000 described above with reference to FIG. 10. In step 2811, the sacrificial gates are replaced with replacement gates (such as, for example, the replacement gates 2305 illustrated in FIGS. 23A and 23B) as described above with reference to FIGS. 22A-22C and 23A-23C. In step 2813, a second dielectric layer (such as, for example, the dielectric layer 2401 illustrated in FIGS. 24A-24C) is formed over the first dielectric layer and the replacement gates as described above with reference to FIGS. 24A-24C. In step 2815, gate contact plugs (such as, for example, the contact plugs 2501 illustrated in FIGS. 25A-25C) and source/gate contact plugs (such as, for example, the contact plugs 2503 illustrated in FIGS. 25A-25C) are formed as described above with reference to FIGS. 24A-24C and 25A-25C.

According to an embodiment, a method includes: forming a trench in a substrate; forming a liner layer along sidewalls and a bottom of the trench; forming a silicon-rich layer over the liner layer, where forming the silicon-rich layer includes: flowing a first silicon precursor into a process chamber for a first time interval; and flowing a second silicon precursor and a first oxygen precursor into the process chamber for a second time interval, the second time interval being different from the first time interval; and forming a dielectric layer over the silicon-rich layer. In an embodiment, forming the silicon-rich layer further includes: flowing a third silicon precursor into the process chamber for a third time interval; and flowing a fourth silicon precursor and a second oxygen precursor into the process chamber for a fourth time interval, the fourth time interval being different from the third time interval. In an embodiment, the first silicon precursor and the second silicon precursor includes a same chemical. In an embodiment, the method further includes performing an ultraviolet/oxygen treatment on the dielectric layer. In an embodiment, performing the ultraviolet/oxygen treatment on the dielectric layer includes subjecting the dielectric layer to an ultraviolet radiation in an oxygen ambient. In an embodiment, the method further includes, after preforming the ultraviolet/oxygen treatment, performing a thermal treatment on the dielectric layer.

According to another embodiment, a method includes: patterning a substrate to form trenches therein, portions of the substrate between adjacent trenches forming semiconductor strips; and forming isolation regions in the trenches, portions of the semiconductor strips extending above the isolation regions forming fins, wherein forming the isolation regions includes: conformally forming a first liner layer in the trenches; forming a first silicon-rich layer over the first liner layer, where forming the first silicon-rich layer includes: flowing a first silicon precursor into a process chamber for a first number of cycles; and flowing a second silicon precursor and a first oxygen precursor into the process chamber for a second number of cycles, the second number of cycles being different from the first number of cycles; and forming a first dielectric layer over the first silicon-rich layer. In an embodiment, forming the first silicon-rich layer further includes: flowing a third silicon precursor into the process chamber for a third number of cycles; and flowing a fourth silicon precursor and a second oxygen precursor into the process chamber for a fourth number of cycles, the fourth number of cycles being different from the third number of cycles. In an embodiment, conformally forming the first liner layer in the trenches includes depositing a dielectric material along sidewalls and bottoms of the trenches using an atomic layer deposition (ALD) process. In an embodiment, forming the first dielectric layer includes flowing a third silicon precursor, a second oxygen precursor, and an oxygen-containing plasma into the process chamber for a third number of cycles. In an embodiment, the method further includes: forming sacrificial gates along sidewalls and top surfaces of the fins; conformally forming a second liner layer over the sacrificial gates; forming a second silicon-rich layer over the second liner layer, where forming the second silicon-rich layer includes: flowing a third silicon precursor into the process chamber for a third number of cycles; and flowing a fourth silicon precursor and a second oxygen precursor into the process chamber for a fourth number of cycles, the fourth number of cycles being different from the third number of cycles; and forming a second dielectric layer over the second silicon-rich layer. In an embodiment, the method further includes: performing an ultraviolet/oxygen treatment on the first dielectric layer; and after preforming the ultraviolet/oxygen treatment, performing a thermal treatment on the first dielectric layer. In an embodiment, performing the ultraviolet/oxygen treatment on the first dielectric layer includes subjecting the first dielectric layer to an ultraviolet radiation in an oxygen ambient.

According to yet another embodiment, a method includes: forming isolation regions in a substrate, portion of the substrate extending between and over adjacent isolation regions forming fins; forming sacrificial gates along sidewalls and top surfaces of the fins; forming a first liner layer along sidewalls and over top surfaces of the sacrificial gates; forming a first silicon-rich layer over the first liner layer, where forming the first silicon-rich layer includes: flowing a first silicon precursor into a process chamber for a first number of cycles; and flowing a second silicon precursor and a first oxygen precursor into the process chamber for a second number of cycles, the second number of cycles being different from the first number of cycles; and forming a first dielectric layer over the first silicon-rich layer. In an embodiment, forming the first silicon-rich layer further includes: flowing a third silicon precursor into the process chamber for a third number of cycles; and flowing a fourth silicon precursor and a second oxygen precursor into the process chamber for a fourth number of cycles, the fourth number of cycles being different from the third number of cycles. In an embodiment, forming the isolation regions includes: patterning the substrate to form trenches in the substrate; conformally forming a second liner layer in the trenches; forming a second silicon-rich layer over the second liner layer, where forming the second silicon-rich layer includes: flowing a third silicon precursor into the process chamber for a third number of cycles; and flowing a fourth silicon precursor and a second oxygen precursor into the process chamber for a fourth number of cycles, the fourth number of cycles being different from the third number of cycles; and forming a second dielectric layer over the second silicon-rich layer. In an embodiment, forming the first dielectric layer includes flowing a third silicon precursor, a second oxygen precursor, and an oxygen-containing plasma into the process chamber for a third number of cycles. In an embodiment, the method further includes performing an ultraviolet/oxygen treatment on the first dielectric layer. In an embodiment, the method further includes, after preforming the ultraviolet/oxygen treatment, performing a thermal treatment on the first dielectric layer. In an embodiment, the first silicon precursor and the second silicon precursor include a same chemical.

According to yet another embodiment, A device includes: a semiconductor strip supported by a substrate; a gate structure along sidewalls and a top surface of the semiconductor strip; a source/drain region adjacent the gate structure and extending into the semiconductor strip; a first liner extending along a sidewall of the gate structure and a top surface of the source/drain region; a first silicon-rich layer over the first liner; and a first dielectric layer over the first silicon-rich layer.

According to yet another embodiment, a device includes: a substrate; a semiconductor strip extending from the substrate; an isolation region over the substrate and adjacent the semiconductor strip; a gate structure over the semiconductor strip; a first liner extending along a sidewall of the gate structure and a top surface of the isolation region; a first silicon-rich layer over the first liner; and a first dielectric layer over the first silicon-rich layer.

According to yet another embodiment, a device includes: a substrate; a semiconductor strip extending away from a first surface of the substrate; an isolation region over the substrate and adjacent the semiconductor strip, the isolation region includes: a first liner extending along a sidewall of the semiconductor strip and the first surface of the substrate; a first silicon-rich layer over the first liner; and a first dielectric layer over the first silicon-rich layer; a gate structure over the semiconductor strip; a second liner extending along a sidewall of the gate structure and a top surface of the isolation region; a second silicon-rich layer over the second liner; and a second dielectric layer over the second silicon-rich layer.

The fins may be formed by any suitable method. For example, the fins may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor strip supported by a substrate;
a gate structure along sidewalls and a top surface of the semiconductor strip;
a source/drain region adjacent the gate structure and extending into the semiconductor strip;
a first liner extending along a sidewall of the gate structure and a top surface of the source/drain region;
a first silicon-rich layer over the first liner; and
a first dielectric layer over the first silicon-rich layer.

2. The device of claim 1, wherein silicon content of the first silicon-rich layer is between about 30 atomic % and about 40 atomic %.

3. The device of claim 1, wherein the first silicon-rich layer comprises silicon oxide.

4. The device of claim 1, further comprising:
an isolation region over the substrate and adjacent the semiconductor strip, the isolation region comprising:
a second liner extending along the sidewalls of the semiconductor strip and a top surface of the substrate;
a second silicon-rich layer over the second liner; and
a second dielectric layer over the second silicon-rich layer.

5. The device of claim 4, wherein silicon content of the second silicon-rich layer is between about 30 atomic % and about 40 atomic %.

6. The device of claim 4, wherein the second silicon-rich layer comprises silicon oxide.

7. The device of claim 4, wherein the second silicon-rich layer and the second dielectric layer comprise a same material.

8. A device comprising:
a substrate;
a semiconductor strip extending from the substrate;
an isolation region over the substrate and adjacent the semiconductor strip;
a gate structure over the semiconductor strip;
a first liner extending along a sidewall of the gate structure and a top surface of the isolation region;
a first silicon-rich layer over the first liner; and
a first dielectric layer over the first silicon-rich layer, wherein a top surface of the gate structure is level with a top surface of the first dielectric layer.

9. The device of claim 8, wherein silicon content of the first silicon-rich layer is between about 30 atomic % and about 40 atomic %.

10. The device of claim 8, wherein the first silicon-rich layer comprises silicon oxide.

11. The device of claim 8, wherein the isolation region comprises:
a second dielectric layer; and
a second silicon-rich layer lining sidewalls and a bottom surface of the second dielectric layer.

12. The device of claim 11, wherein the second silicon-rich layer has a thickness between 3 Å and 5 Å.

13. The device of claim 11, wherein the second silicon-rich layer and the second dielectric layer comprise a same material.

14. The device of claim 11, wherein silicon content of the second silicon-rich layer is between about 30 atomic % and about 40 atomic %.

15. A device comprising:
a substrate;
a semiconductor strip extending away from a first surface of the substrate;
an isolation region over the substrate and adjacent the semiconductor strip, the isolation region comprising:
a first liner extending along a sidewall of the semiconductor strip and the first surface of the substrate;
a first silicon-rich layer over the first liner; and
a first dielectric layer over the first silicon-rich layer;
a gate structure over the semiconductor strip;
a second liner extending along a sidewall of the gate structure and a top surface of the isolation region;
a second silicon-rich layer over the second liner; and a second dielectric layer over the second silicon-rich layer.

16. The device of claim 15, wherein the first liner has a thickness between 20 Å and 40 Å.

17. The device of claim 15, wherein silicon content of the first silicon-rich layer is between about 30 atomic % and about 40 atomic %.

18. The device of claim 15, wherein the first silicon-rich layer comprises an oxide material.

19. The device of claim 15, wherein the first silicon-rich layer has a thickness between 8 Å and 12 Å.

20. The device of claim 15, wherein silicon content of the second silicon-rich layer is between about 30 atomic % and about 40 atomic %.

\* \* \* \* \*